(12) United States Patent  (10) Patent No.: US 7,840,193 B2
Hara et al.  (45) Date of Patent: Nov. 23, 2010

(54) TRANSMITTER AND COMMUNICATION APPARATUS

(75) Inventors: Yoshihiro Hara, Osaka (JP); Shigeru Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 678 days.

(21) Appl. No.: 11/907,380

(22) Filed: Oct. 11, 2007

(65) Prior Publication Data

US 2009/0098839 A1    Apr. 16, 2009

(51) Int. Cl.
  *H04B 1/02*    (2006.01)
(52) U.S. Cl. ................. 455/102; 455/115.1; 455/114.2; 455/127.3; 330/135; 330/136; 375/297
(58) Field of Classification Search ................. 455/102, 455/115.1, 114.2, 127.3; 330/135, 136; 375/297
  See application file for complete search history.

(56) References Cited

U.S. PATENT DOCUMENTS

| 6,366,177 B1 * | 4/2002 | McCune et al. ............. 332/103 |
| 6,701,138 B2 | 3/2004 | Epperson et al. |
| 7,116,951 B2 * | 10/2006 | Nagode et al. .............. 455/126 |
| 7,499,502 B2 * | 3/2009 | Morimoto et al. ........... 375/297 |

OTHER PUBLICATIONS

"Simple polar-loop transmitter for dual-mode Bluetooth", Takashi Oshima and Masaru Kokubo, Hitachi, Ltd., Central Research Laboratory, Circuits and Systems, 2005, ISCAS 2005. IEEE International Symposium on May 23-26, 2005, pp. 3966-3969, vol. 4.

* cited by examiner

*Primary Examiner*—Sanh D Phu
(74) *Attorney, Agent, or Firm*—Wenderoth, Lind & Ponack, L.L.P.

(57) ABSTRACT

A modulator 23 corrects an amplitude signal Rd by adding thereto an offset value α and generates, based on the corrected amplitude signal Rd, an amplitude signal Ra for amplitude-modulating a radio-frequency signal. The modulator 23 includes: an offset voltage measurement section 109 operable to measure an offset voltage $V_{2cal}$ of the amplitude signal Ra; a correction value calculation section 110 operable to obtain a difference value $\Delta V_{2cal}$ between the offset voltage $V_{2cal}$ measured by the offset voltage measurement section 109 and an initial value of the offset voltage $V_{2cal}$ and operable to calculate, based on the difference value $\Delta V_{2cal}$, a correction value $V_{ODAC}$ for correcting the offset voltage $V_{2cal}$; and an addition section 106 operable to add the correction value $V_{ODAC}$ calculated by the correction value calculation section 110 to a signal processed until the amplitude signal Ra is generated from the amplitude signal Rd.

18 Claims, 16 Drawing Sheets

F I G. 1
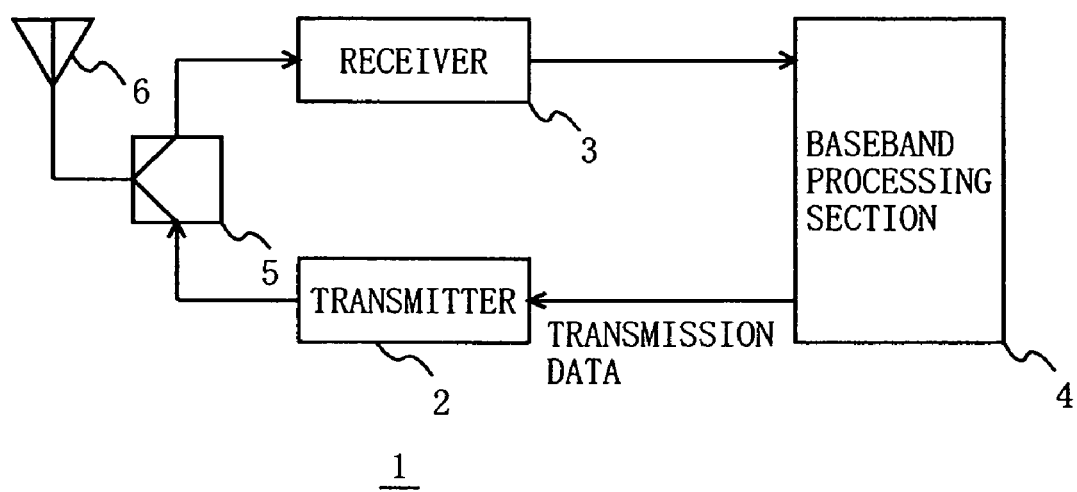

F I G. 9

| TEMPERATURE DIFFERENCE | DIFFERENCE VALUE OF $V_{AMO}$ |
|---|---|
| ... | ... |
| −10°C | a1 |
| −9°C | a2 |
| ... | ... |
| 0°C | ai |
| +1°C | aj |
| ... | ... |
| +9°C | ax |
| +10°C | ay |
| ... | ... |

TRANSMITTER AND COMMUNICATION APPARATUS

BACKGROUND OF THE INVENTION

1. Field of the Invention

The present invention relates to a modulator for generating a modulation signal for amplitude-modulating a radio-frequency signal, and particularly to a modulator having a function of correcting nonlinearity, and also a transmitter and a communication terminal, each using the modulator.

2. Description of the Background Art

An example of a system for amplitude-modulating a radio-frequency signal may include a polar modulation system. FIG. 16 is a diagram showing an example structure of a polar modulator 900 used in a transmitter of a conventional polar modulation system (see FIG. 1 of "Simple polar-loop transmitter for dual-mode Bluetooth", Takashi Oshima and Masaru Kokubo, Hitachi Ltd., Central Research Laboratory, Circuits and Systems, 2005. ISCAS 2005. IEEE International Symposium on 23-26 May 2005 Page(s): 3966-3969 Vol. 4). In FIG. 16, the conventional polar modulator 900 includes an I/Q conversion section 901, a polar conversion section 902, an AM modulation section 903, a PM modulation section 904, and a power amplifier (PA) 905. The I/Q conversion section 901 receives transmission data including information to be transmitted. The I/Q conversion section 901 converts the transmission data into an in-phase component and a quadrature component, and outputs the in-phase component and the quadrature component as an I signal and a Q signal which are digital, respectively. The polar conversion section 902 converts the I signal and the Q signal which are outputted from the I/Q conversion section 901, into an amplitude component and a phase component of polar coordinates, and outputs the amplitude component and the phase component as an amplitude signal R and a phase signal θ which are digital, respectively. The AM modulation section 903 converts the amplitude signal R into an analog value, and inputs the analog value to the power amplifier 905. The PM modulation section 904, which includes a PLL circuit containing a voltage controlled oscillator, changes the phase of an output signal from the voltage controlled oscillator based on the phase signal θ, and inputs a phase-modulated radio-frequency signal to the power amplifier 905. The power amplifier 905 modulates the amplitude of the radio-frequency signal outputted from the PM modulation section 904, based on the amplitude signal R outputted from the AM modulation section 903, and outputs the modulated signal to an antenna side. As a result, the transmission data is polar-modulated and then transmitted from an antenna.

In the conventional polar modulator 900, distortion may occur in the amplitude signal R due to nonlinearity of the AM modulation section 903 and the power amplifier 905. Therefore, a system is proposed for correcting such nonlinearity. FIG. 17A is a diagram showing an example structure of the AM modulation section 903 having a conventional system for correcting the nonlinearity. In FIG. 17A, the AM modulation section 903 includes a table section 906, a correction section 907, a digital-to-analog conversion section 908, a first amplification section 909, and a second amplification section 910.

FIG. 17B is a diagram showing the relationship between an input digital value to the AM modulation section 903 and an output analog value from the power amplifier 905. As shown in FIG. 17B, the input digital value is in a nonlinear relationship with the output analog value. Particularly, in the relationship between the input digital value and the output analog value, an offset value a is produced due to the offset of the digital-to-analog conversion section 908 and the DC offset voltages of the first amplification section 909, the second amplification section 910 and the power amplifier 905. In order to correct the nonlinearity and the offset value a, the AM modulation section 903 corrects the amplitude signal R in the table section 906 and the correction section 907.

FIG. 17C is a diagram showing the characteristics of a correction table stored in the table section 906. In FIG. 17C, a dashed curve is input/output characteristics shown in FIG. 17B and a solid curve is the characteristics of the correction table. The correction table is created based on the reverse characteristics of the input/output characteristics shown in FIG. 17B. In the correction table, the offset value a is added to the input digital value such that when the input digital value is "0", the corrected digital value is "a".

The correction section 907 outputs, based on the table section 906, a digital signal having the corrected digital value corresponding to the digital value of the inputted amplitude signal R. The digital-to-analog conversion section 908 converts the corrected digital signal into an analog signal, and inputs the analog signal to the first amplification section 909. The first amplification section 909 amplifies the analog signal from the digital-to-analog conversion section 908, in accordance with transmission power requested by the system. The second amplification section 910 amplifies by a certain fixed gain the analog signal outputted from the first amplification section 909, and inputs the analog signal to the power amplifier 905, such that the power amplifier 905 can operate. The power amplifier 905 amplitude-modulates a phase signal which is a radio-frequency signal, based on the analog amplitude signal inputted from the second amplification section 910. As a result of the corrections made by the correction section 907, the input/output characteristics are linearized as indicated by a solid straight line in FIG. 17D.

As shown in FIG. 17C, the conventional AM modulation section 903 prepares the correction table based on the reverse characteristics of nonlinearity characteristics, and corrects the input digital signal. However, the characteristics of the devices used in the AM modulation section 903 temporally change due to so-called aging characteristics, temperature changes, and the like. Accordingly, the nonlinearity characteristics also temporally change. Particularly, the temporal changes of the offset value may be great depending on a device. The conventional AM modulation section 903, however, cannot correct the input digital signal in accordance with the above-described temporal changes of the offset value.

SUMMARY OF THE INVENTION

Therefore, an object of the present invention is to provide, in a system for amplitude-modulating a radio-frequency signal, a modulator capable of correcting nonlinearity even when an offset value temporally changes, and also a transmitter and a communication terminal, each using the modulator.

To attain the above-mentioned object, the present invention has the following features. The present invention is directed to a modulator for correcting an input signal by at least adding thereto a predetermined offset value and for generating, based on the corrected input signal, an amplitude signal for amplitude-modulating a radio-frequency signal, the modulator including: an offset voltage measurement section operable to measure an offset voltage of the amplitude signal; a correction value calculation section operable to obtain an amount of change of the offset voltage measured by the offset voltage measurement section and operable to calculate, based on the amount of change, a correction value for correcting the offset voltage; and an addition section operable to add the correction value calculated by the correction value calculation section to a specific signal processed until the amplitude signal is generated from the input signal.

When an offset value of input/output characteristics changes due to temporal changes, the offset voltage of the amplitude signal changes. Therefore, the amount of change of the offset voltage may be measured, whereby it is possible to follow the changes, caused by the temporal changes, of the offset value. According to the present invention, since the correction value for correcting the offset voltage is determined based on the amount of change of the offset voltage and then the correction value is added to a specific signal, it is possible to change the specific signal in accordance with the changes of the offset value. Thus, the modulator capable of correcting nonlinearity even when the temporal changes occur is provided.

It is preferable that the correction value calculation section may determine the correction value based on a value obtained by dividing the amount of change of the offset voltage by an amplification factor obtained after the correction value is added. Consequently, the correction value is appropriately determined.

Further, the correction value calculation section may calculate the correction value at the start of transmission, and the addition section may add the correction value to the specific signal at the start of the transmission. As described above, the correction value is calculated and added at the start of the transmission, whereby the transmission is started in a state where the nonlinearity is corrected. Consequently, it is possible to improve transmission quality.

Further, when the offset voltage measurement section includes an analog-to-digital conversion section operable to convert the measured offset voltage into a digital signal, the amplitude signal may be a signal of which the offset voltage, measured by the offset voltage measurement section, can be analog-to-digital converted by the analog-to-digital conversion section. Thus, it is possible to measure the offset voltage, away from an unmeasurable area (a dead zone) of the analog-to-digital conversion section. Consequently, it is possible to improve accuracy of the nonlinearity correction.

Further, when the radio-frequency signal is amplitude-modulated by the amplitude signal in a power amplifier, a temperature detection section operable to detect a temperature and a storage section operable to have stored therein a relationship between a DC offset voltage and a temperature of the power amplifier may be included, and with reference to the storage section, the correction value calculation section may obtain an amount of change of the DC offset voltage based on the temperature detected by the temperature detection section and may calculate, based on the amount of change of the DC offset voltage, the correction value for correcting the offset voltage.

As a result of the temporal changes of the DC offset voltage of the power amplifier, the offset voltage of the amplitude signal changes, and therefore the nonlinearity correction is not made as desired. In response, the correction value may be calculated based on the amount of change of the DC offset voltage and then the correction value may be added to a specific signal, whereby it is possible to change the offset voltage of the amplitude signal so as to correct the nonlinearity. Thus, the modulator capable of correcting the nonlinearity more reliably is provided.

It is preferable that the correction value calculation section may determine the correction value based on a value obtained by dividing the amount of change of the DC offset voltage by an amplification factor obtained after the correction value is added. Consequently, the correction value is appropriately determined.

Further, the correction value calculation section may calculate the correction value during transmission, and the addition section may add the correction value to the specific signal during the transmission. Thus, it is possible to correct the nonlinearity even when temperature changes occur during the transmission. Consequently, it is possible to further improve transmission quality.

Further, the correction value calculation section may calculate the correction value based on the amount of change of the offset voltage and the amount of change of the DC offset voltage at the start of transmission, and the addition section may add the correction value to the specific signal at the start of the transmission. As a result, the correction value is determined following the change of the offset voltage and the change of the DC offset voltage. Consequently, it is possible to further improve accuracy of the nonlinearity correction. Further, the correction value is calculated and added at the start of the transmission, whereby the transmission is started in a state where the nonlinearity is corrected. Consequently, it is possible to improve transmission quality.

Note that the correction value calculation section may determine the correction value based on a value obtained by dividing a difference value between the amount of change of the DC offset voltage and the amount of change of the offset voltage, by an amplification factor obtained after the correction value is added. Consequently, the correction value is appropriately determined.

The addition section may be provided at a position of adding the correction value to the specific signal which is analog or may be provided at a position of adding the correction value to the specific signal which is digital. In either case, it is possible to increase the offset voltage of the amplitude signal in amount corresponding to the correction value. In the first case, when the addition section is provided at a stage preceding an amplification section operable to amplify the amplitude signal, it is possible to add the correction value with low power. In the latter case, when a correction section operable to correct the input signal which is digital and a signal conditioning section operable to linear-transform the digital signal outputted from the correction section are further included and the addition section is provided within the signal conditioning section, the addition section provided within the signal conditioning section can also be used for adding the correction value. Consequently, it is possible to reduce the modulator in size and reduce costs. Further, since it is possible to increase the offset voltage of the amplitude signal in amount corresponding to the correction value only by a calculation process such as addition of a digital signal, it is possible to reduce the modulator in size and reduce costs, also in this aspect. Alternatively, in the latter case, when a correction section operable to correct the input signal which is digital is further included and the addition section is provided at a stage following the correction section, it is possible to increase the offset voltage of the amplitude signal in amount corresponding to the correction value only by a calculation process such as addition of a digital signal. Consequently, it is possible to reduce the modulator in size and reduce costs.

Further, included are: an I/Q conversion section operable to convert transmission data into an in-phase component and a quadrature component; a polar conversion section operable to convert the in-phase component and the quadrature component which are obtained by the I/Q conversion section, into an amplitude component and a phase component, respectively; a modulation section operable to convert the amplitude component into an analog signal and operable to output the analog signal as an amplitude signal; a PM modulation section operable to phase-modulate a radio-frequency signal based on the phase component; and a power amplification section operable to modulate the radio-frequency signal outputted from the PM modulation section, by the amplitude signal outputted from the modulation section and output a transmission signal. Thus, a transmitter and a communication terminal, each capable of correcting nonlinearity even when temporal changes occur, can be realized.

Obviously, the process performed by each element of the modulator can also be viewed as a modulation method. Further, only the temporal changes of the DC offset voltage of the power amplifier may be corrected by the temperature detection section, the storage section, the correction value calculation section, and addition section, without including the offset voltage measurement section.

As described above, according to the present invention, it is possible to correct nonlinearity even when an offset value temporally changes. Further, according to the present invention, it is possible to improve transmission quality, improve accuracy of nonlinearity correction, reduce power, reduce a device in size, and reduce costs.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a structure of a communication terminal 1 according to first through sixth embodiments of the present invention;

FIG. 9 is a diagram showing an example of a temperature-DC offset voltage table;

FIG. 10 is a flow chart showing an operation, performed after the signal conditioning values are stored, of the modulator 23a;

FIG. 11 is a diagram showing a time series of the operation, from the production stage to a time after the shipment, of the modulator 23a;

DESCRIPTION OF THE PREFERRED EMBODIMENTS

Figure 2:
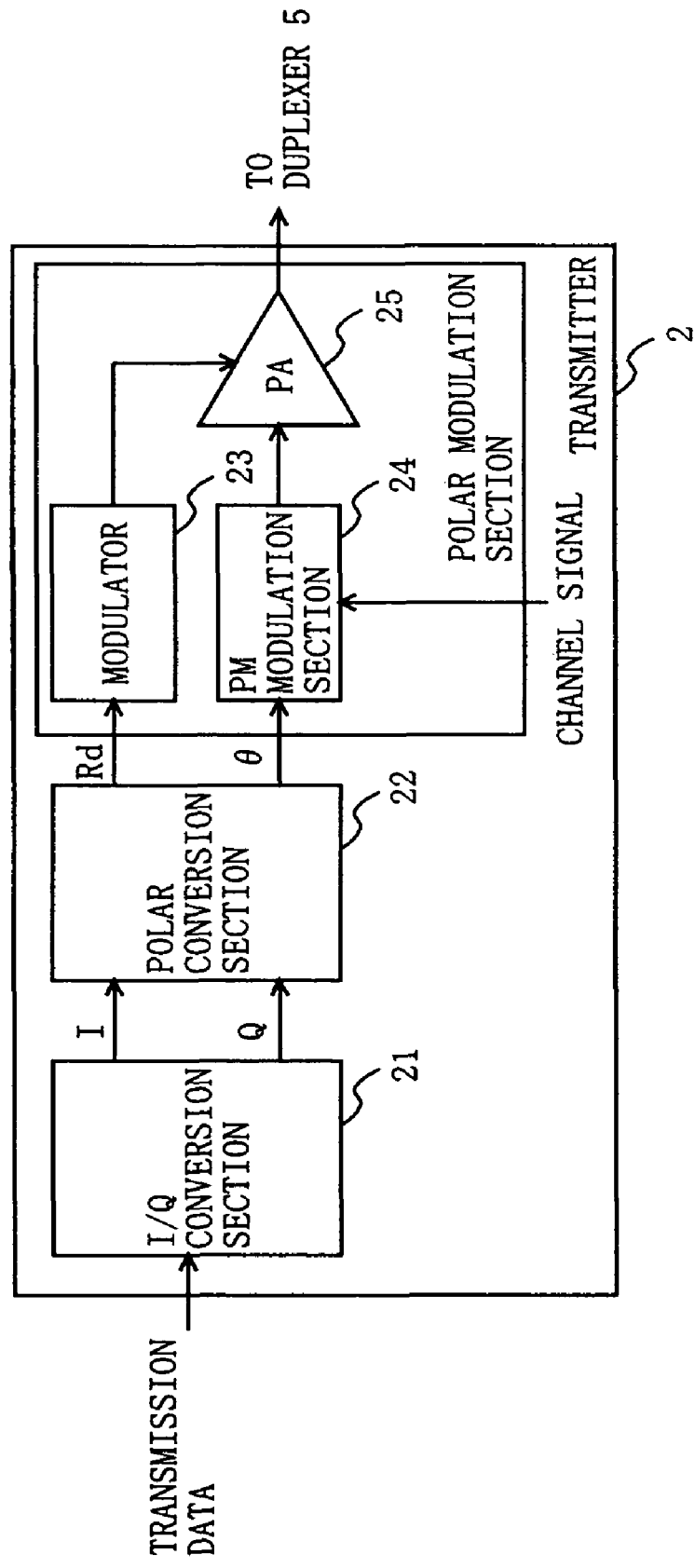
FIG. 2 is a diagram showing a structure of a transmitter 2 of FIG. 1.

FIG. 1 is a diagram showing a structure of a communication terminal 1 using a modulator according to each embodiment of the present invention. In FIG. 1, the communication terminal 1 includes a transmitter 2, a receiver 3, a baseband processing section 4, a duplexer 5, and an antenna 6. The baseband processing section 4 inputs to the transmitter transmission data including information to be transmitted. The transmitter 2 performs modulation based on the transmission data and inputs a transmission signal to the duplexer 5. The duplexer 5 transmits the transmission signal to the antenna 6. As a result, the transmission signal is outputted from the antenna 6. On the other hand, a reception signal received by the antenna 6 is inputted to the receiver 3 via the duplexer 5. The receiver 3 demodulates the reception signal and inputs the reception signal to the baseband processing section 4. The baseband processing section 4 processes the demodulated reception signal and appropriately processes audio, video, data, and the like.

FIG. 2 is a block diagram showing a structure of the transmitter 2 of FIG. 1. In FIG. 2, the transmitter 2 constituting a polar modulation system includes an I/Q conversion section 21, a polar conversion section 22, a modulator 23 (and modulators 23a through 23e), a PM modulation section 24, and a power amplifier (PA) 25. The I/Q conversion section 21 converts the transmission data into an in-phase component and a quadrature component, and outputs the in-phase component and the quadrature component as an I signal and a Q signal which are digital, respectively. The polar conversion section 22 converts the I signal and the Q signal which are outputted from the I/Q conversion section 21, into an amplitude component and a phase component of polar coordinates, and outputs the amplitude component and the phase component as an amplitude signal Rd and a phase signal θ which are digital, respectively. The PM modulation section 24 includes a voltage controlled oscillator and a PLL circuit, each capable of outputting a signal at a certain frequency based on a channel signal having a certain digital value. The PM modulation section 24 changes the phase of the output signal from the voltage controlled oscillator based on the phase signal θ, and inputs a phase-modulated radio-frequency signal to the power amplifier 25.

The modulator 23 (and the modulators 23a through 23e) converts the amplitude signal Rd into an analog value, generates an amplitude signal for amplitude-modulating the radio-frequency signal outputted from the PM modulation section 24, and inputs the amplitude signal to the power amplifier 25. The modulator 23 (and the modulators 23athrough 23e), which is an element having the features of the present invention, will be described in detail in the following embodiments. The power amplifier 25 amplitude-modulates the radio-frequency signal outputted from the PM modulation section 24, based on the amplitude signal outputted from the modulator 23, and transmits the modulated signal to the duplexer 5. As a result, the transmission data is polar-modulated and then transmitted from the antenna 6.

Note that the transmitter 2 using the modulator according to each of the embodiments of the present invention is not limited to the polar modulation system, and is applicable to any system including a modulator for generating an amplitude signal for amplitude-modulating a radio-frequency signal.

First Embodiment

Figure 3:
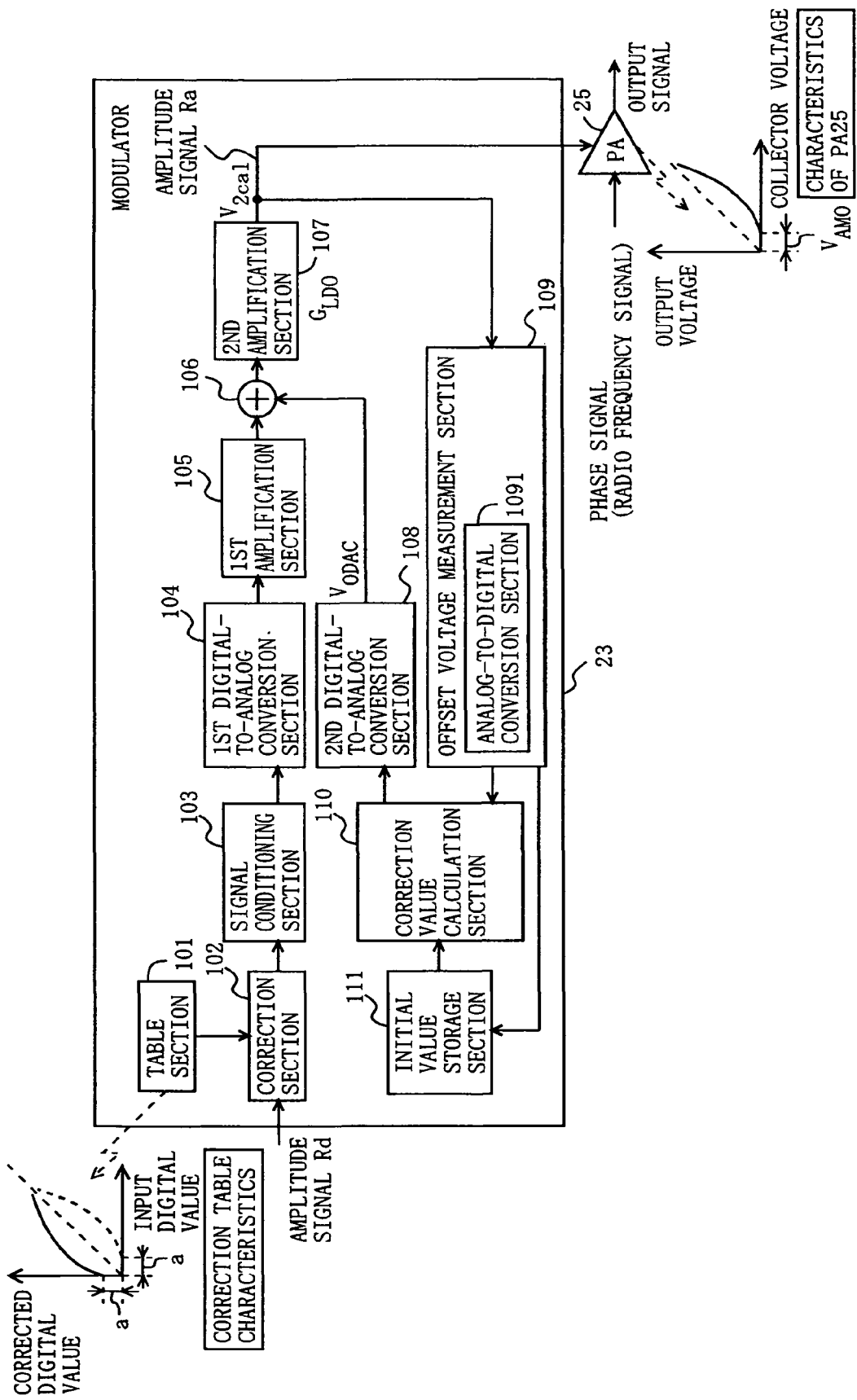
FIG. 3 is a diagram showing a structure of a modulator 23 according to the first embodiment of the present invention.

FIG. 3 is a diagram showing a structure of the modulator 23 according to a first embodiment of the present invention. In FIG. 3, the modulator 23 includes a table section 101, a correction section 102, a signal conditioning section 103, a first digital-to-analog conversion section 104, a first amplification section 105, an addition section 106, a second amplification section 107, a second digital-to-analog conversion section 108, an offset voltage measurement section 109, a correction value calculation section 110, and an initial value storage section 111.

When the amplitude signal Rd is converted into an analog signal without being corrected at all, regardless of the presence of the offset of the first digital-to-analog conversion section 104 and the DC offset voltages of the first amplification section 105, the second amplification section 107 and the power amplifier 25 and is outputted from the power amplifier 25, input/output characteristics have a certain offset value a. In FIG. 3, at the lower right, illustrated is a diagram showing the relationship between the collector voltage and the output voltage of the power amplifier 25. As shown in FIG. 3, the DC offset voltage of the power amplifier 25 will be denoted as $V_{AMO}$.

The table section 101 has stored therein a correction table used for correcting nonlinearity present from an input to the modulator 23 to an output from the power amplifier 25. In FIG. 3, at the upper left, illustrated is a diagram showing the characteristics of the correction table indicating the relationship between an input digital value and a corrected digital value. As shown in FIG. 3, the correction table has the reverse characteristics of nonlinearity characteristics present from an input to the modulator 23 to an output from the power amplifier 25. In the present invention, the correction table is defined as making corrections such that an offset value a is at least added to the input digital value. Note that in the present invention, a section for adding a predetermined offset value a to an amplitude signal is not limited to the correction section 102.

For example, an offset value storage section (not shown) having stored therein a digital value corresponding to the offset value a may be provided. Until the correction value calculation section 110 calculates a correction value, the second digital-to-analog conversion section 108 converts the digital value stored in the offset value storage section into an analog signal such as a voltage signal, and inputs the analog signal to the addition section 106. The addition section 106 adds the signal from the second digital-to-analog conversion section 108 to an output signal from the first amplification section 105. The predetermined offset value a may be added in the above-described manner. Note that the offset value storage section may be provided within the initial value storage section 111.

Additionally, for example, a voltage generation section (not shown) for generating a voltage corresponding to the offset value a may be provided such that the addition section 106 adds the voltage, generated by the voltage generation section and corresponding to the offset value a, to an amplitude signal outputted from the first amplification section 105. Further, a section for adding the predetermined offset value a may be any section preceding a stage of inputting an amplitude signal to the power amplifier 25, and therefore is not particularly specified. That is, an object of the present invention is to provide, for a modulator for making corrections by at least adding the offset value a to an amplitude signal which is an input signal, a modulator capable of responding to temporal changes.

The correction section 102 corrects, based on the correction table stored in the table section 101, the inputted amplitude signal Rd which is digital, and inputs the corrected digital signal to the signal conditioning section 103. The signal conditioning section 103 performs a predetermined linear-transformation for the inputted digital signal. Specifically, the signal conditioning section 103 multiplies the inputted digital signal by a certain digital value k, also adds a certain digital value Δx to the inputted digital signal, and outputs the digital signal. The signal conditioning section 103 will be described in detail below.

The first digital-to-analog conversion section 104 converts the digital signal from the signal conditioning section 103 into an analog signal, and inputs the analog signal to the first amplification section 105. The first amplification section 105 amplifies the analog signal from the first digital-to-analog conversion section 104, in accordance with transmission power requested by the system. The second amplification section 107 amplifies by a certain fixed gain the analog signal outputted from the first amplification section 105, and inputs the amplified signal as an amplitude signal Ra to the power amplifier 25, such that the power amplifier 25 can operate. Here, the amplification factor of the second amplification section 107 is $G_{LDO}$. The power amplifier 25 may be, for example, an HBT (Heterojunction Bipolar Transistor). For example, the amplitude signal from the second amplification section 107 may be applied as the collector voltage of the power amplifier 25 and amplitude-modulate the radio-frequency signal.

Figure 4:
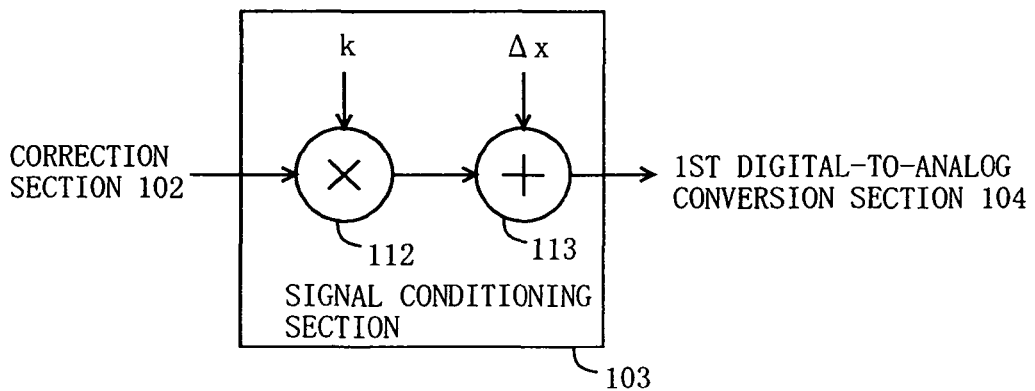
FIG. 4 is a diagram showing an example structure of a signal conditioning section 103 of FIG. 3.

FIG. 4 is a diagram showing an example structure of the signal conditioning section 103. In FIG. 4, the signal conditioning section 103 includes a multiplication section 112 and an addition section 113. The multiplication section 112 multiplies by k the corrected digital signal inputted from the correction section 102. The addition section 113 adds Δx to the digital signal multiplied by k, and inputs the digital signal to the first digital-to-analog conversion section 104. As a result, the digital signal outputted from the correction section 102 is linear-transformed. k and Δx are values determined at the production stage. Even when the table section 101 and the correction section 102 make corrections, the nonlinearity may not be completely corrected, since characteristics may vary starting from an input to the modulator 23 to an output from the power amplifier 25, due to individual variations of the device per se. In order to respond to such individual variations, k and Δx are determined for each single modulator 23 at the production stage, and signal conditioning is performed by the signal conditioning section 103.

As described above, at the production stage, the correction table is determined, k and Δx (hereinafter referred to as signal conditioning values) which are used for signal conditioning are determined, and the determined signal conditioning values are stored in the signal conditioning section 103.

Figure 5:
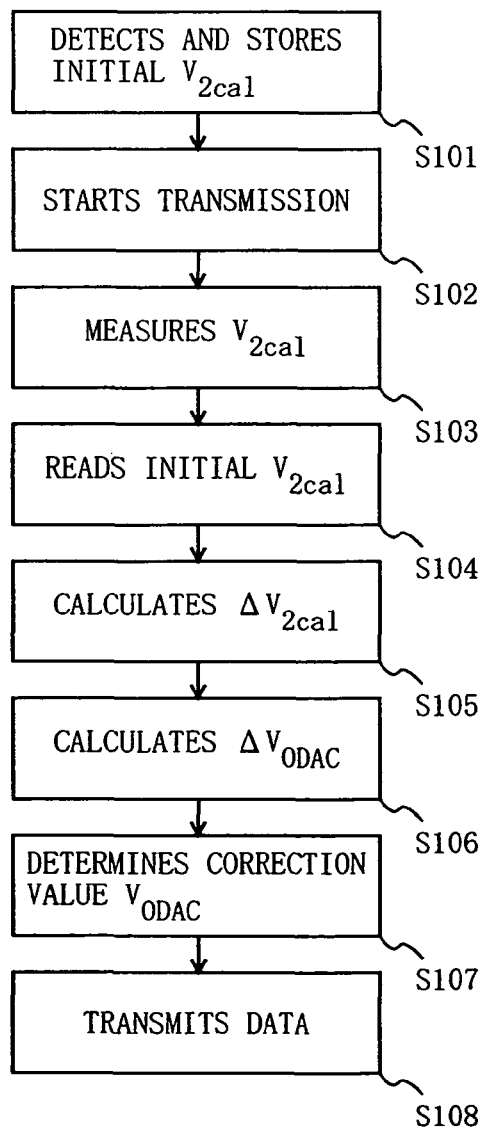
FIG. 5 is a flow chart showing an operation, performed after signal conditioning values are stored, of the modulator 23.

FIG. 5 is a flow chart showing an operation, performed after the signal conditioning values k and Δx are stored, of the modulator 23. Note that the operation timing of the modulator 23 is controlled by a control section not shown in the figures.

After the signal conditioning values k and Δx are determined, at the production stage, a signal having a digital value "0" is inputted as the amplitude signal Rd, whereby the offset voltage measurement section 109 measures the voltage $V_{2cal}$ of the amplitude signal Ra outputted from the second amplification section 107. The voltage $V_{2cal}$, measured in the case of the digital value "0", of the amplitude signal Ra is the offset voltage of the amplitude signal Ra. In an analog-to-digital conversion section 1091, the offset voltage measurement section 109 converts the measured offset voltage $V_{2cal}$ into a digital value, and stores as an initial value of the offset voltage $V_{2cal}$ the digital value in the initial value storage section 111 (step S101). After the initial value of the offset voltage $V_{2cal}$ is stored, the product is shipped.

In order to also respond to the temporal changes, occurring after the product is shipped, of the offset value a, the present invention performs the operation of and after step S102. When a transmission process is started (step S102), the operation of steps S103 through S107 is performed until transmission of data is actually started (step S108).

In step S103, the control section not shown in the figures inputs as the amplitude signal Rd a signal having a digital value "0" to the correction section 102. Then, the offset voltage measurement section 109 measures the offset voltage $V_{2cal}$ of the amplitude signal Ra outputted from the second amplification section 107, converts the offset voltage $V_{2cal}$ into a digital value in the analog-to-digital conversion section 1091, and inputs the digital value to the correction value calculation section 110.

Next, with reference to the initial value storage section 111, the correction value calculation section 110 reads the initial value of the offset voltage $V_{2cal}$ (step S104) Next, the correction value calculation section 110 calculates a difference value $\Delta V_{2cal}$ between the offset voltage $V_{2cal}$ measured by the offset voltage measurement section 109 and the read initial value of the offset voltage $V_{2cal}$, and obtains the amount of change of the offset voltage $V_{2cal}$ (step S105). Next, in accordance with the following equation (1), the correction value calculation section 110 obtains as a correction value difference $\Delta V_{ODAC}$ a value obtained by dividing the difference value $\Delta V_{2cal}$ by an amplification factor $G_{LDO}$, obtained after the correction value is added, of the second amplification section 107 (step S106).

$$\Delta V_{ODAC} = -\Delta V_{2cal}/G_{LDO} \quad (1)$$

The correction value difference $\Delta V_{ODAC}$ has plus and minus values.

Note that in the above equation (1), the denominator is the amplification factor $G_{LDO}$ of the second amplification section 107. However, when a device (except for the power amplifier 25), other than the second amplification section 107, which changes a gain is present at a stage following the addition section 106, the denominator of the above equation (1) is required to be determined after adding the gain of the device thereto. Therefore, accuracy is further improved when the denominator of the above equation (1) is the ultimate value of the amplification factor obtained after the correction value is added.

Next, the correction value calculation section 110 determines, based on the obtained correction value difference $\Delta V_{ODAC}$, a correction value $V_{ODAC}$ to be added in the addition section 106 (step S107). Various methods may be possible for determining the correction value $V_{ODAC}$ in step S107. For example, the following four operation cases may be possible.

First, consider a case where as shown in FIG. 3, the predetermined offset value a is added in the correction section 102 based on the table section 101. In this case, possible cases are: a case (hereinafter referred to as operation case 1) where the correction value $V_{ODAC}$ temporarily stored in the correction value calculation section 110 is deleted at the completion of the transmission and the correction value $V_{ODAC}$ is newly determined when the transmission is subsequently restarted, whereby the newly determined correction value $V_{ODAC}$ is added; and a case (hereinafter referred to as operation case 2) where, even if the transmission is completed, the most-recently-used correction value $V_{ODAC}$ is stored in the correction value calculation section 110, whereby the correction value $V_{ODAC}$ is added using the stored correction value $V_{ODAC}$ when the transmission is subsequently restarted. In the correction value calculation section 110: in operation case 1, it is set as correction value $V_{ODAC}$=correction value difference $\Delta V_{ODAC}$; and in operation case 2, it is set as correction value $V_{ODAC}$=(most-recently-used and stored correction value $V_{ODAC}$)+(correction value difference $\Delta V_{ODAC}$).

Next, consider a case where the offset voltage a stored in the offset value storage section not shown in the figure is converted into an analog signal in the second digital-to-analog conversion section 108 and then added in the addition section 106. In this case, possible cases are: a case (hereinafter referred to as operation case 3) where the correction value $V_{ODAC}$ temporarily stored in the correction value calculation section 110 is deleted at the completion of the transmission and the correction value $V_{ODAC}$ is newly determined when the transmission is subsequently restarted, whereby the newly determined correction value $V_{ODAC}$ is added; and a case (hereinafter referred to as operation case 4) where, even if the transmission is completed, the most-recently-used correction value $V_{ODAC}$ is stored in the correction value calculation section 110, whereby the correction value $V_{ODAC}$ is added using the stored correction value $V_{ODAC}$ when the transmission is subsequently restarted. In the correction value calculation section 110: in operation case 3, it is set as correction value $V_{ODAC}$=(offset voltage a)+(correction value difference $\Delta V_{ODAC}$); and in operation case 4, it is set as correction value $V_{ODAC}$=(offset voltage a)+(most-recently-used and stored correction value $V_{ODAC}$)+(correction value difference $\Delta V_{ODAC}$).

Note that in operation cases 3 and 4, after the correction value $V_{ODAC}$ is calculated, the second digital-to-analog conversion section 108 converts the calculated correction value $V_{ODAC}$ into an analog signal and inputs the analog signal to the addition section 106, without using the offset voltage a stored in the offset value storage section not shown in the figures.

Additionally, the correction value $V_{ODAC}$ may be appropriately determined in accordance with a variation of a section for adding the predetermined offset value a.

The correction value $V_{ODAC}$ is converted into an analog signal in the second digital-to-analog conversion section 108 and inputted to the addition section 106. During the transmission of the data (step S108), the addition section 106 adds the correction value $V_{ODAC}$ converted into the analog signal (e.g., a voltage), to the analog signal outputted from the first amplification section 105, and inputs the analog signal to the second amplification section 107.

Next, described is the reason why in the first embodiment, it is possible to correct the nonlinearity even when the offset value a temporally changes.

In a case where it is assumed that the characteristics of the power amplifier 25 do not temporally change, the cause of the temporal changes of the offset value a may be the temporal changes of the offset of the first digital-to-analog conversion section 104 and those of the DC offset voltages of the first amplification section 105 and the second amplification section 107. When the offset and the DC offset voltages temporally change, the value of the offset voltage $V_{2cal}$ changes. In the first embodiment, the amount of change of the value of the offset voltage $V_{2cal}$ is detected, and the correction value $V_{ODAC}$ is obtained based on the amount of change of the offset voltage $V_{2cal}$ and the amplification factor $G_{LDO}$ of the second amplification section 107, whereby the correction value $V_{ODAC}$ is added in the addition section 106.

Accordingly, a value corresponding to the amount of change of the offset voltage $V_{2cal}$ is added to the amplitude signal Ra. Therefore, even when the offset voltage $V_{2cal}$ changes as a result of the temporal changes of the offset of the first digital-to-analog conversion section 104 and those of the DC offset voltages of the first amplification section 105 and the second amplification section 107, the offset voltage $V_{2cal}$ increases or decreases by the correction value $V_{ODAC}$. Consequently, the offset voltage $V_{2cal}$ returns to a value for correcting the nonlinearity. Thus, in the first embodiment, it is possible to correct the nonlinearity even when the offset value a temporally changes.

Figure 6:
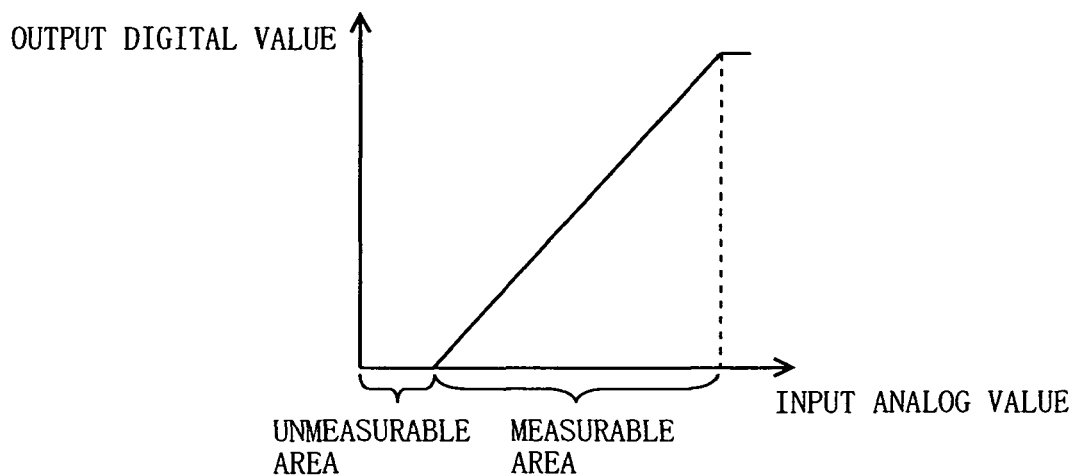
FIG. 6 is a diagram showing the characteristics of an analog-to-digital conversion section 1091 included in an offset voltage measurement section 109 of FIG. 3.

FIG. 6 is a diagram showing the characteristics of the analog-to-digital conversion section 1091 included in the offset voltage measurement section 109. As shown in FIG. 6, when an input analog value (here, the voltage value of the amplitude signal Ra) is small, the analog-to-digital conversion section 1091 has an unmeasurable area in which the input analog value cannot be converted into a digital value. When the input analog value is more than a certain value corresponding to a measurable area, the analog-to-digital conversion section 1091 can convert the input analog value into a digital value. The unmeasurable area may be, for example, an area corresponding to a few mV. Therefore, the offset voltage measurement section 109 cannot measure the offset voltage $V_{2cal}$ of a few mV. In the first embodiment, however, since the offset voltage measurement section 109 measures the offset voltage $V_{2cal}$ outputted from the second amplification section 107, the offset voltage is, as a rule, approximately 100 mV. That is, the amplitude signal Rd is amplified or converted so as to be converted from analog to digital in the analog-to-digital conversion section 1091. Thus, in the first embodiment, it is possible to detect the offset voltage $V_{2cal}$, away from the unmeasurable area (also referred to as a dead zone) of the analog-to-digital conversion section 1091. Note that the characteristics of the analog-to-digital conversion section 1091 are merely illustrative, and it is to be understood that the analog-to-digital conversion section 1091 having no unmeasurable area may be used.

Figure 7:
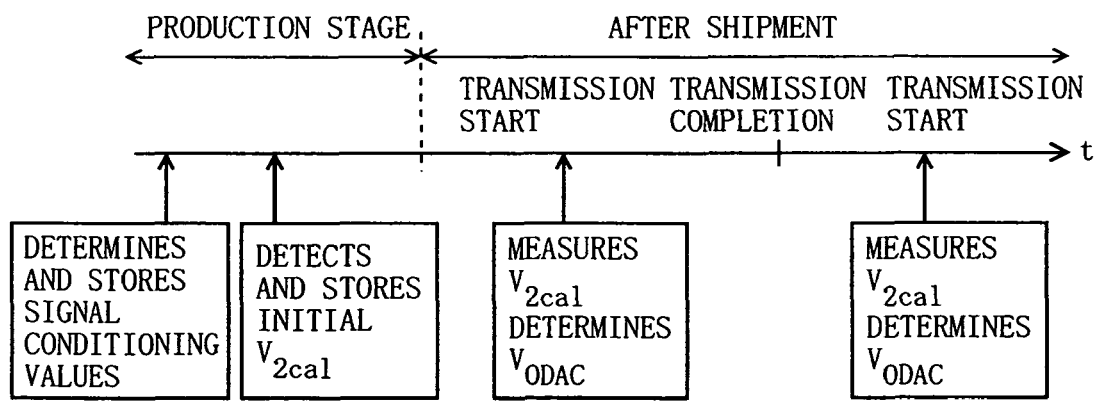
FIG. 7 is a diagram showing a time series of the operation, from the production stage to a time after the shipment, of the modulator 23.

FIG. 7 is a diagram showing a time series of the operation, from the production stage to a time after the shipment, of the modulator 23. As shown in FIG. 7, at the production stage, the signal conditioning values k and Δx are determined and stored, and the initial value of the offset voltage $V_{2cal}$ is measured and stored. After the shipment, the offset voltage $V_{2cal}$ is measured and the correction value $V_{ODAC}$ is determined, each time the transmission is started. Note that corrections including the measurement of the offset voltage $V_{2cal}$ and the determination of the correction value $V_{ODAC}$ may not necessarily be made at the timing given each time the transmission is started.

As described above, in the first embodiment, at the start of the transmission, the offset voltage $V_{2cal}$ of the amplitude signal Ra is measured and the correction value $V_{ODAC}$ is determined based on the amount of change of the offset voltage $V_{2cal}$, whereby the correction value $V_{ODAC}$ is added so as to correct the nonlinearity. Thus, it is possible to correct the nonlinearity even when the offset value temporally changes.

Note that there may be a method of preparing a plurality of patterns of correction tables in the table section 101 in advance so as to correct the nonlinearity in accordance with the temporal changes. In the first embodiment, however, since such correction tables are not required to be prepared, it is possible to correct the nonlinearity in accordance with the temporal changes without using large capacity memory.

Further, in the first embodiment, the amount of change of the offset voltage $V_{2cal}$ is obtained only at the start of the transmission. However, even during the transmission, it is possible to obtain the amount of change of the offset voltage $V_{2cal}$ by obtaining, when "0" has been inputted as the amplitude signal Rd, the offset voltage $V_{2cal}$ measured at the input timing.

Further, although in the first embodiment, the amount of change of the offset voltage $V_{2cal}$ is obtained when "0" has been inputted as the amplitude signal Rd, the present invention is not limited thereto. Even when a value other than "0" is inputted, the correction value $V_{ODAC}$ can be calculated by setting a certain value as an input value and obtaining the amount of change of the offset voltage $V_{2cal}$. For example, by setting the certain value as "a0" and storing in the initial value storage section 111 the initial value, obtained when the value "a0" is inputted, of the offset voltage $V_{2cal}$, the correction value $V_{ODAC}$ may be obtained based on the amount of change of the offset voltage $V_{2cal}$ and the amplification factor obtained at a measuring point.

Further, in the first embodiment, the input digital signal is corrected in the correction section 102 based on the correction table. However, the input digital signal may be converted into an analog signal, and then the analog signal may be corrected using the correction table.

Further, in the first embodiment, a low-pass filter may be appropriately provided. For example, a low-pass filter may be provided at a stage following the first amplification section 105 or at a stage following the second amplification section 107.

Note that these variations are similarly applicable to the modulators 23a through 23e according to the below-described second through sixth embodiments.

Second Embodiment

Since structures of a communication terminal and a transmitter of the second embodiment are similar to those of the first embodiment, FIGS. 1 and 2 are used therefor. Further, in the second embodiment, elements having the same functions as those of the first embodiment will be denoted by the same reference numerals, and therefore will not be described.

Figure 8:
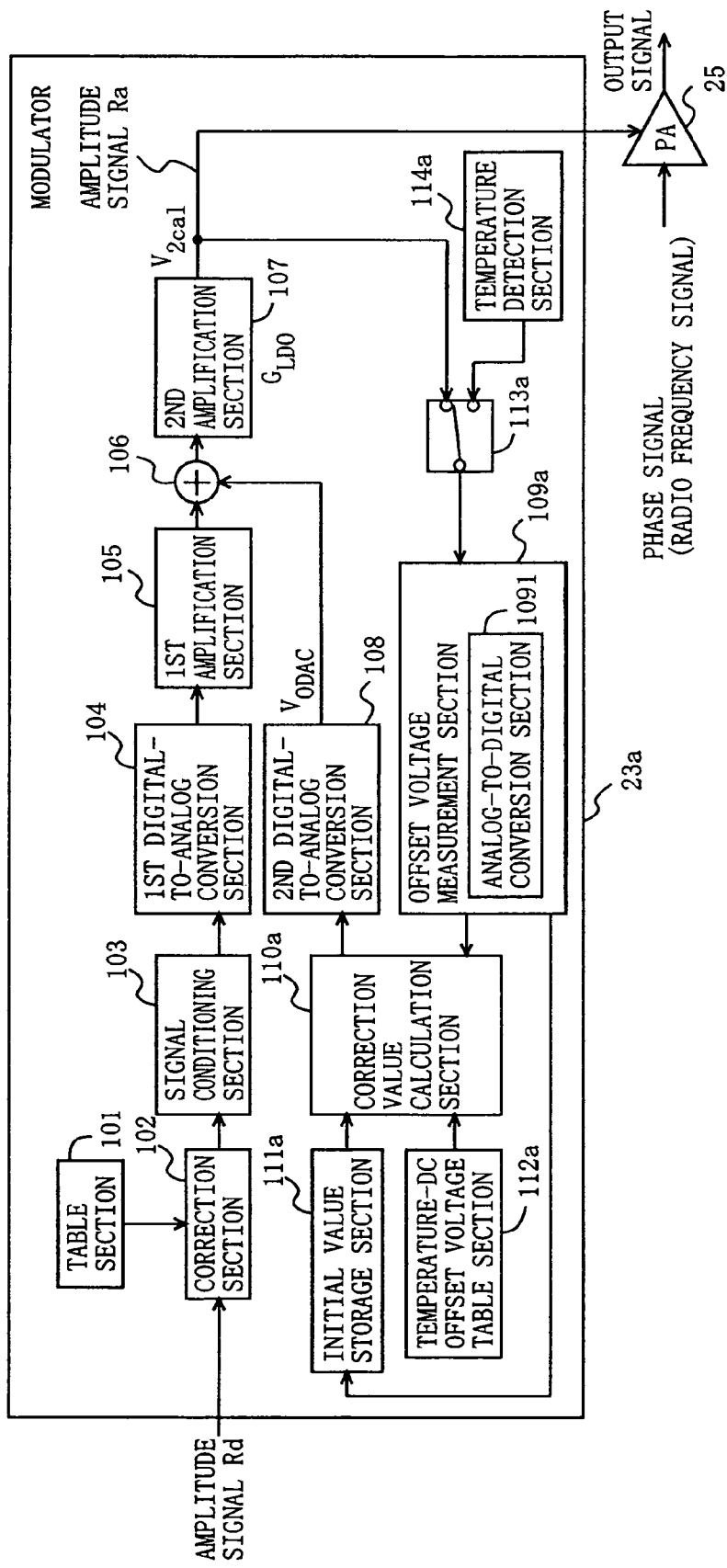
FIG. 8 is a diagram showing a structure of a modulator 23a according to the second embodiment of the present invention.

FIG. 8 is a diagram showing a structure of the modulator 23a according to the second embodiment of the present invention. In FIG. 8, the modulator 23a includes the table section 101, the correction section 102, the signal conditioning section 103, the first digital-to-analog conversion section 104, the first amplification section 105, the addition section 106, the second amplification section 107, the second digitalto-analog conversion section 108, an offset voltage measurement section 109a, a correction value calculation section 110a, an initial value storage section 111a, a temperature-DC offset voltage table section 112a, a switch section 113a, and a temperature detection section 114a.

The initial value storage section 111a has stored therein, as well as the initial value of the offset voltage $V_{2cal}$, information (hereinafter referred to as initial temperature information (a digital value)) regarding an initial temperature (a temperature measured when the initial value of the offset voltage $V_{2cal}$ is determined: normally, a room temperature), measured at the production stage, of the power amplifier 25. In association with information regarding a temperature difference, the temperature-DC offset voltage table section 112a has stored therein, as a temperature-DC offset voltage table, digital values corresponding to the difference from a value, obtained at the initial temperature, of the DC offset voltage $V_{AMO}$ of the power amplifier 25. FIG. 9 is a diagram showing an example of the temperature-DC offset voltage table. As shown in FIG. 9, in association with the temperature difference between the initial temperature and the current temperature, the temperature-DC offset voltage table section 112a has stored therein the digital values " ..., al, ..., ay, ... " corresponding to the difference from a value, obtained at the initial temperature, of the DC offset voltage $V_{AMO}$. As described above, a difference value of the DC offset voltage $V_{AMO}$ may be stored in association with the temperature difference, and thus it is possible to reduce effects caused by individual variations.

Note that when the temperature difference is proportional to the difference value of the DC offset voltage $V_{AMO}$, the value of $\alpha = \Delta V_{AMO}/\Delta T$ (the temperature difference) may be stored as a temperature coefficient $\alpha$ so as to obtain the difference value $\Delta V_{AMO}$ based on the temperature coefficient $\alpha$ and the measured temperature difference $\Delta T$. Consequently, it is possible to save the amount of memory.

Further, the temperature-DC offset voltage table may have stored therein a temperature and a value, corresponding to the temperature, of the DC offset voltage $V_{AMO}$. In this case, the difference value $\Delta V_{AMO}$ may be obtained based on the difference between the initial DC offset voltage $V_{AMO}$ and the measured DC offset voltage $V_{AMO}$.

Figure 10:
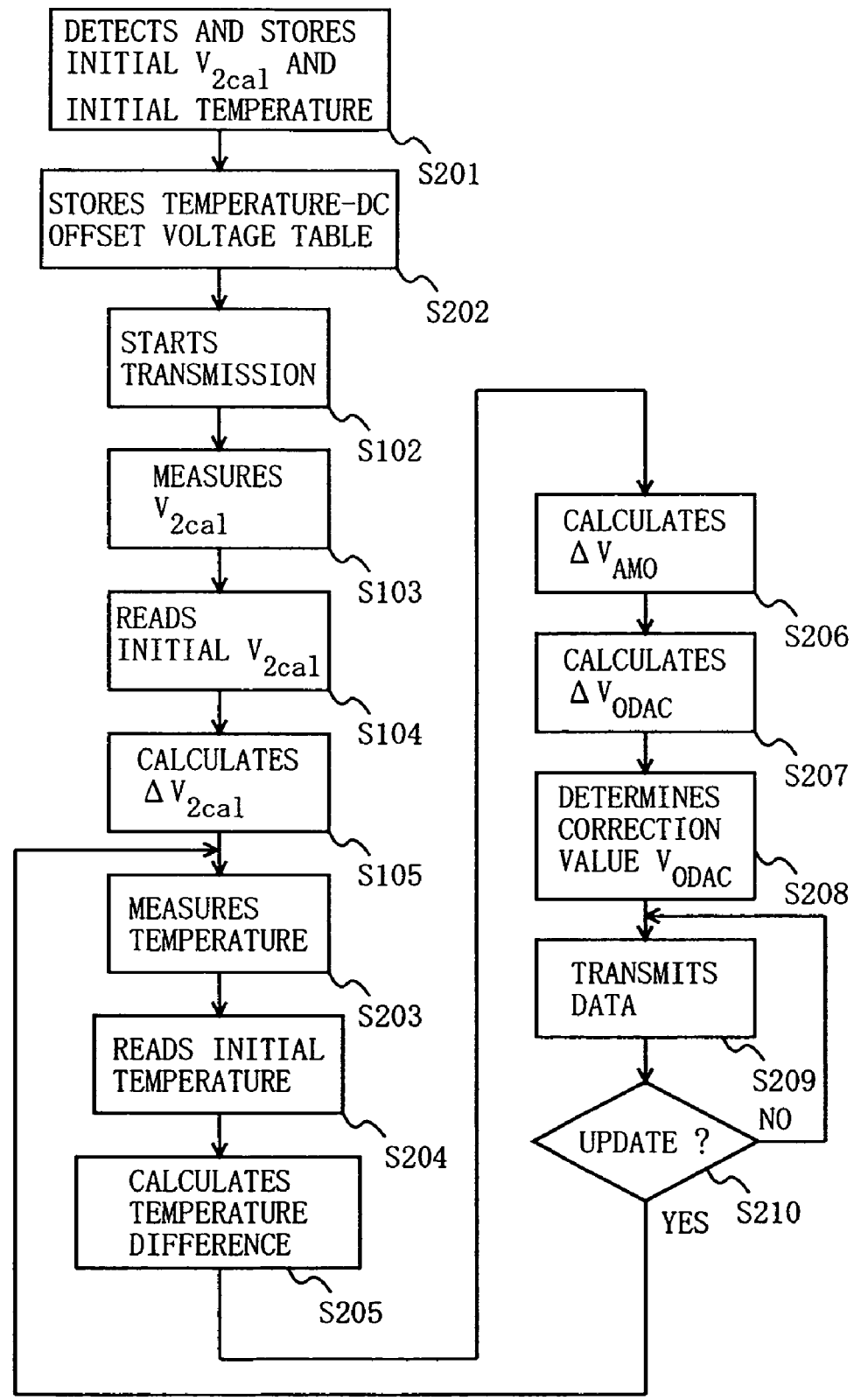

FIG. 10 is a flow chart showing an operation, performed after the signal conditioning values k and $\Delta x$ are stored, of the modulator 23a. Note that the operation timing of the modulator 23a is controlled by the control section not shown in the figures. In FIG. 10, the same operation as that shown in FIG. 5 will be denoted by the same step number, and therefore will not be described.

First, in step S201, the initial value of the offset voltage $V_{2cal}$ is measured in a similar manner to the first embodiment and stored in the initial value storage section 111a. Additionally, the initial temperature, measured at the production stage, of the power amplifier 25 is stored in the initial value storage section 111a.

After the operation of step S201, the temperature-DC offset voltage table is stored in the temperature-DC offset voltage table section 112a (step S202). By providing a temperature change to the power amplifier 25 to be actually used, the difference value of the measured DC offset voltage $V_{AMO}$ may be stored in the temperature-DC offset voltage table section 112a. Alternatively, an average difference value, corresponding to temperature changes, of the DC offset voltage $V_{AMO}$ of the power amplifier 25 to be used may be stored in the temperature-DC offset voltage table section 112a. Any known method can be employed for measuring the difference value of the DC offset voltage $V_{AMO}$.

After the operation of steps S102 through S105, the switch section 113a is switched to connect the offset voltage measurement section 109a to the temperature detection section 114a. An analog signal relating to the temperature detected by the temperature detection section 114a is converted into a digital signal in the analog-to-digital conversion section 1091 and inputted to the correction value calculation section 110a (step S203).

Next, with reference to the initial value storage section 111a, the correction value calculation section 110a reads the initial temperature, measured at the production stage, of the power amplifier 25 (step S204), and calculates the temperature difference between the initial temperature and the current temperature (step S205). Next, with reference to the temperature-DC offset voltage table section 112a, the correction value calculation section 110a calculates the difference value $\Delta V_{AMO}$, corresponding to the measured temperature difference, of the DC offset voltage (the difference value $\Delta V_{AMO}$ corresponding to an arbitrary temperature difference is calculated by linear interpolation and the like).

Then, in accordance with the following equation (2), the correction value calculation section 110a obtains as the correction value difference $\Delta V_{ODAC}$ a value obtained by dividing a value obtained by subtracting the difference value $\Delta V_{2cal}$ from the difference value $\Delta V_{AMO}$, by the amplification factor $G_{LDO}$, obtained after the correction value is added, of the second amplification section 107 (step S207).

$$\Delta V_{ODAC} = (\Delta V_{AMO} - \Delta V_{2cal})/G_{LDO} \tag{2}$$

The correction value difference $\Delta V_{ODAC}$ has plus and minus values.

Next, the correction value calculation section 110a determines, based on the obtained correction value difference $\Delta V_{ODAC}$, the correction value $V_{ODAC}$ to be added in the addition section 106 (step S208). Then, the modulator 23a transmits data (step S209). During the transmission of the data, the correction value $V_{ODAC}$ is added to a specific signal in the addition section 106.

During the transmission of the data, it is determined at predetermined intervals whether or not the correction value $V_{ODAC}$ is to be updated (step S210). When the correction value $V_{ODAC}$ is to be updated, the operation returns to step S203. Note that the data is being transmitted concurrently during the process. When the operation returns to step S203, the correction value difference $\Delta V_{ODAC}$ is obtained by the following equation (3) in step S207.

$$\Delta V_{ODAC} = \Delta V_{AMO}/G_{LDO} \tag{3}$$

That is, the correction value $V_{ODAC}$ is determined based on a value obtained by dividing the amount of change of the DC offset voltage by the amplification factor obtained after the correction value is added. When the correction value $V_{ODAC}$ is not to be updated in step S210, the modulator 23a continues to transmit the data.

A method for the correction value calculation section 110a to calculate the correction value difference $\Delta V_{ODAC}$ and to subsequently determine the correction value $V_{ODAC}$ at the start of the transmission (a method for determining the correction value $V_{ODAC}$ to be used for the first time) may include, for example, a method for responding to the following four operation cases.

In operation case 1, it is set as correction value $V_{ODAC}$=correction value difference $\Delta V_{ODAC}$; in operation case 2, it is set as correction value $V_{ODAC}$=(most-recently-used and stored correction value $V_{ODAC}$)+(correction value difference $\Delta V_{ODAC}$); in operation case 3, it is set as correction value $V_{ODAC}$=(offset voltage a)+(correction value difference $\Delta V_{ODAC}$); in operation case 4, it is set as correction value $V_{ODAC}$=(offset voltage a)+(most-recently-used and stored correction value $V_{ODAC}$)+(correction value difference $\Delta V_{ODAC}$).

A method for the correction value calculation section 110a to calculate the correction value difference $\Delta V_{ODAC}$ and to subsequently determine the correction value $V_{ODAC}$ after the operation of step S210 (a method for determining the correction value $V_{ODAC}$ to be used for the second time and thereafter) may be, for example, a method for responding to the following four operation cases.

When an affirmative determination (Yes) is made in the operation of step S210: in operation case 1, it is set as correction value $V_{ODAC}$=correction value difference $\Delta V_{ODAC}$; in operation case 2, it is set as correction value $V_{ODAC}$=(most-recently-used and stored correction value $V_{ODAC}$)+(correction value difference $\Delta V_{ODAC}$); in operation case 3, it is set as correction value $V_{ODAC}$=(offset voltage a)+(correction value difference $\Delta V_{ODAC}$); and in operation case 4, it is set as correction value $V_{ODAC}$=(offset voltage a)+(most-recently-used and stored correction value $V_{ODAC}$)+(correction value difference $\Delta V_{ODAC}$).

Note that in operation cases 3 and 4 of either of the above-described methods, the second digital-to-analog conversion section 108 converts, after the correction value $V_{ODAC}$ is calculated, the calculated correction value $V_{ODAC}$ into an analog signal without using the offset voltage a stored in the offset value storage section not shown in the figures and inputs the analog signal to the addition section 106.

Note that in FIG. 10, the determination, made for the second time and thereafter, of the correction value $V_{ODAC}$ is started from step S203, since the offset voltage $V_{2cal}$ of the amplitude signal Ra cannot be obtained by forcibly setting the amplitude signal Rd as "0" during the transmission of the data. However, even during the transmission of the data, the modulator 23a may detect a point in time at which the amplitude signal Rd is the value "0", and may obtain the offset voltage $V_{2cal}$, obtained at the point in time, of the amplitude signal Ra, and thus it is possible to update the correction value $V_{ODAC}$ by the operation of steps S103 through S208.

Next, described is the reason why in the second embodiment, it is possible to correct the nonlinearity even when the offset value a temporally changes.

In a case where it is assumed that the characteristics of the power amplifier 25 do not temporally change due to temperature changes and the like, the DC offset voltage $\Delta V_{AMO}$ is "0", and thus it is possible to correct the nonlinearity for a reason similar to that given in the first embodiment. In contrast, when the characteristics of the power amplifier 25 temporally change due to temperature changes and the like, the cause of the temporal changes of the offset value a may be the changes of the offset of the first digital-to-analog conversion section 104 and those of the DC offset voltages of the first amplification section 105, the second amplification section 107 and the power amplifier 25. At the start of the transmission, the difference values $\Delta V_{2cal}$ and $\Delta V_{AMO}$ are measured, whereby the amount of change of the cause of changing the offset value a is obtained. In accordance with the above equation (2), the correction value $V_{ODAC}$ is obtained based on the amount of change of the cause and the amplification factor $G_{LDO}$, whereby the correction value $V_{ODAC}$ is added in the addition section 106.

Accordingly, a value corresponding to the amount of change of the offset voltage $V_{2cal}$ and to the amount of change of the DC offset voltage $V_{AMO}$ is added to the amplitude signal Ra. Therefore, even when the offset voltage $V_{2cal}$ and the DC offset voltage $V_{AMO}$ change as a result of the temporal changes of the offsets of the first digital-to-analog conversion section 104, the first amplification section 105 and the second amplification section 107, and those of the characteristics of the power amplifier 25, the offset voltage $V_{2cal}$ increases or decreases by the correction value $V_{ODAC}$. Consequently, the offset voltage $V_{2cal}$ returns to a value for correcting the nonlinearity. During the transmission of the data, a value corresponding to the amount of change of the DC offset voltage $V_{AMO}$ is added to the amplitude signal Ra. Also in this case, even when the DC offset voltage $V_{AMO}$ changes, the offset voltage $V_{2cal}$ increases or decreases by the correction value $V_{ODAC}$. Consequently, the offset voltage $V_{2cal}$ returns to a value for correcting the nonlinearity.

Figure 11:
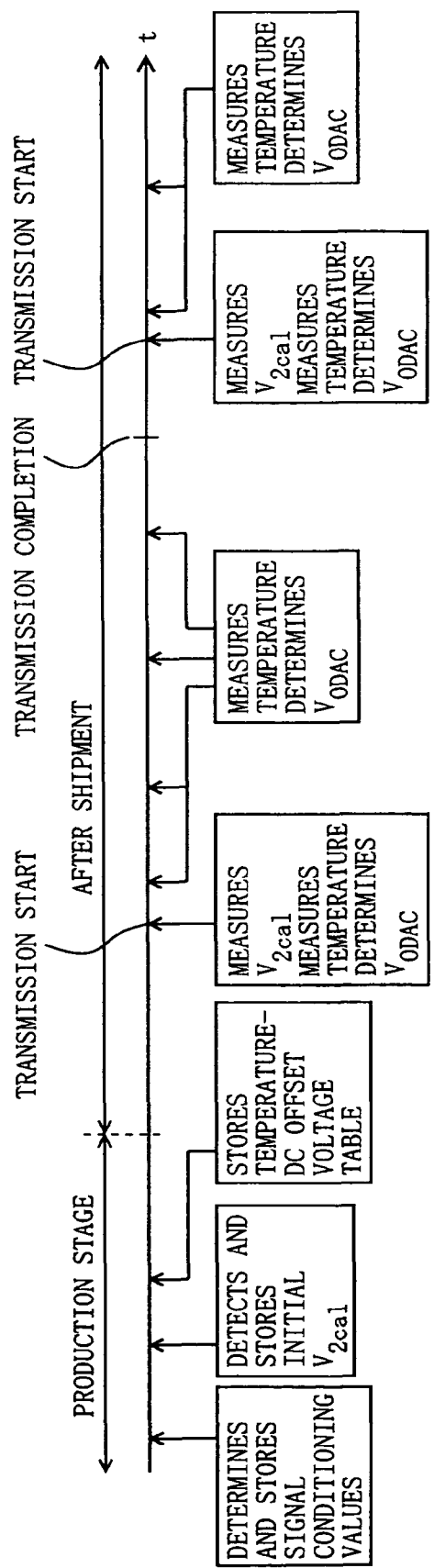

FIG. 11 is a diagram showing a time series of the operation, from the production stage to a time after the shipment, of the modulator 23a. As shown in FIG. 11, at the production stage, the signal conditioning values k and $\Delta x$ are determined and stored, the initial value of the offset voltage $V_{2cal}$ is measured and stored, and additionally, the temperature-DC offset voltage table is stored. After the shipment, the offset voltage $V_{2cal}$ and a temperature are measured and the correction value $V_{ODAC}$ is determined, each time the transmission is started. Note that the measurement of the offset voltage $V_{2cal}$ and of the temperature and the determination of the correction value $V_{ODAC}$ may not necessarily be made at the timing given each time the transmission is started. Even during the transmission, the measurement of the temperature and the determination of the correction value $V_{ODAC}$ may be made at arbitrary timing.

As described above, in the second embodiment, at the start of the transmission, the offset voltage $V_{2cal}$ of the amplitude signal Ra is measured, the DC offset voltage $V_{AMO}$, obtained at the measured temperature, of the power amplifier 25 is obtained, and the correction value $V_{ODAC}$ is determined based on the amount of change of the offset voltage $V_{2cal}$ and on the amount of change of the DC offset voltage $V_{AMO}$, whereby the correction value $V_{ODAC}$ is added so as to correct the nonlinearity. During the transmission, the correction value difference $\Delta V_{ODAC}$ is determined based on the amount of change of the DC offset voltage $V_{AMO}$, whereby the correction value $V_{ODAC}$ is added so as to correct the nonlinearity. Thus, it is possible to correct the nonlinearity even when the offset value temporally changes. Further, similarly to the first embodiment, it is possible to correct the nonlinearity in accordance with the temporal changes without using large capacity memory.

Third Embodiment

Since structures of a communication terminal and a transmitter of the third embodiment are similar to those of the first embodiment, FIGS. 1 and 2 are used therefor. Further, in the third embodiment, elements having the same functions as those of the first and second embodiments will be denoted by the same reference numerals, and therefore will not be described.

Figure 12:
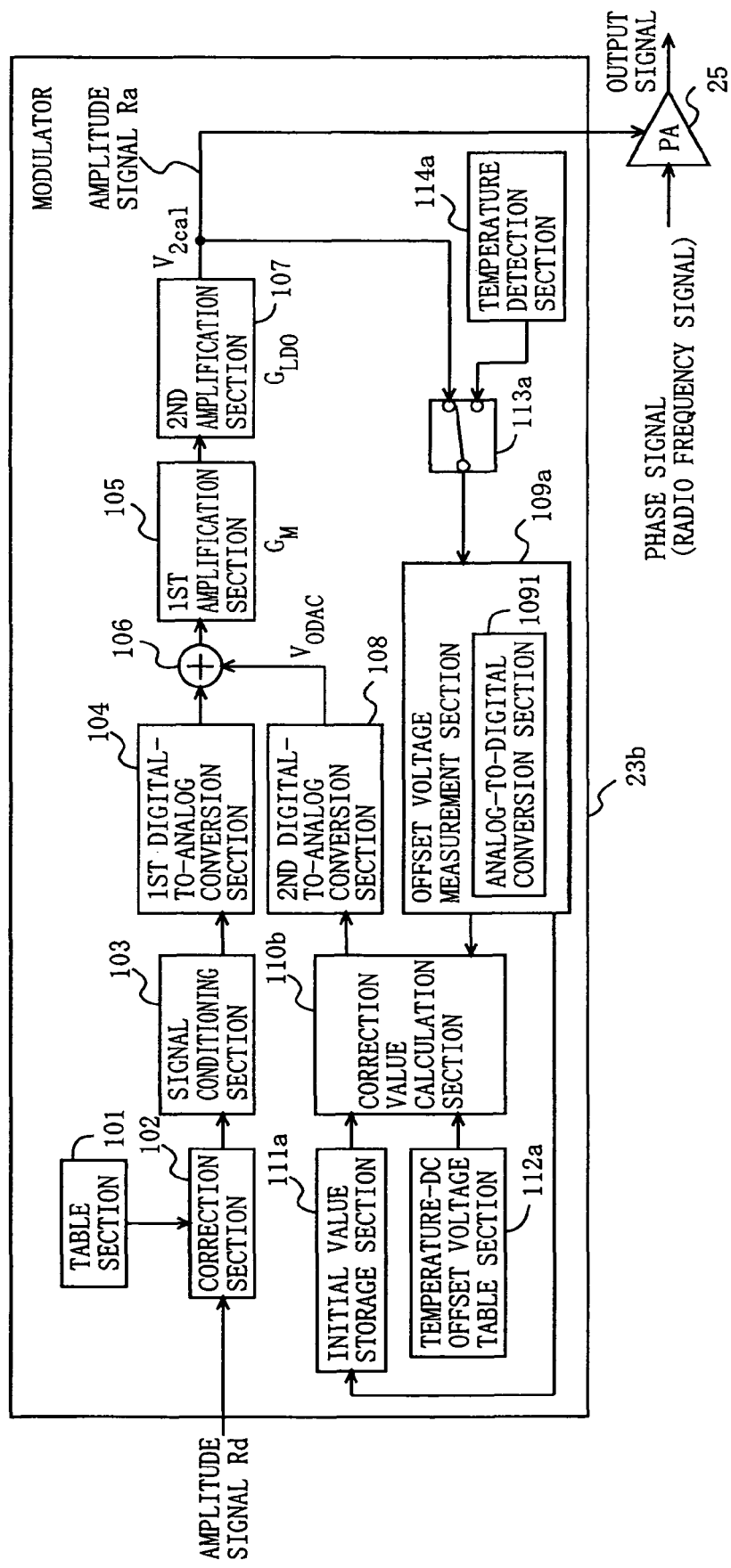
FIG. 12 is a diagram showing a structure of a modulator 23b according to the third embodiment of the present invention.

FIG. 12 is a diagram showing a structure of the modulator 23b according to the third embodiment of the present invention. In the third embodiment, the addition section 106 is provided between the first amplification section 105 and the first digital-to-analog conversion section 104. Therefore, a correction value calculation section 110b obtains the correction value difference $\Delta V_{ODAC}$ using an equation different from that of the second embodiment. Specifically, when the amplification factor of the first amplification section 105 is $G_M$, the correction value difference $\Delta V_{ODAC}$ is obtained by the following equation (4).

$$\Delta V_{ODAC} = (\Delta V_{AMO} - \Delta V_{2cal})/(G_{LDO} \cdot G_M) \quad (4)$$

Note that as a variation of the first embodiment, the addition section 106 may be provided between the first amplification section 105 and the first digital-to-analog conversion section 104 in a similar manner to FIG. 12. In this case, the correction value difference $\Delta V_{ODAC}$ is obtained by the following equation (5).

$$\Delta V_{ODAC} = -\Delta V_{2cal}/(G_{LDO} \cdot G_M) \quad (5)$$

Fourth Embodiment

Since structures of a communication terminal and a transmitter of the fourth embodiment are similar to those of the first embodiment, FIGS. 1 and 2 are used therefor. Further, in the fourth embodiment, elements having the same functions as those of the first and second embodiments will be denoted by the same reference numerals, and therefore will not be described.

Figure 13:
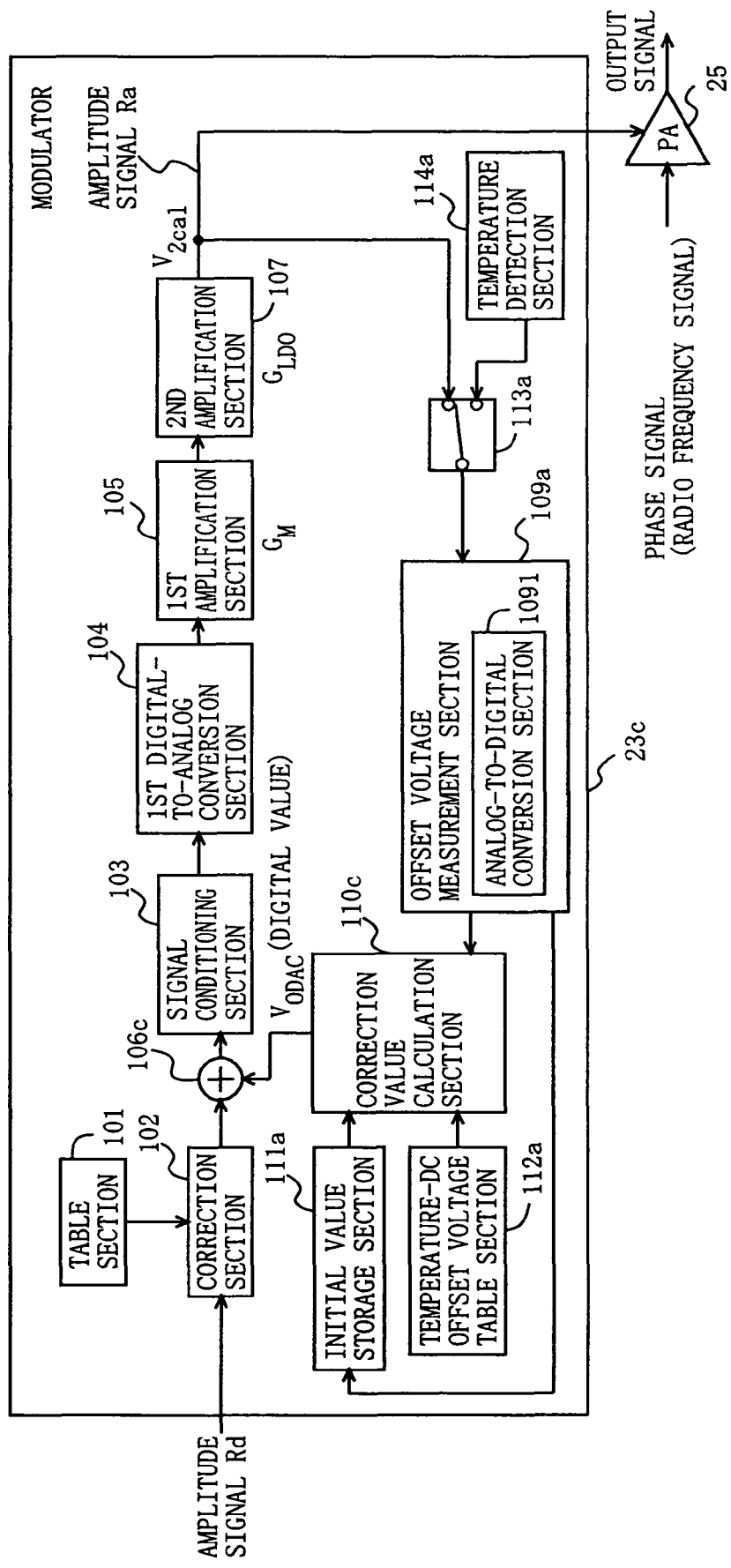
FIG. 13 is a diagram showing a structure of a modulator 23c according to the fourth embodiment of the present invention.

FIG. 13 is a diagram showing a structure of the modulator 23c according to the fourth embodiment of the present invention. In the fourth embodiment, an addition section 106c is provided between the correction section 102 and the signal conditioning section 103. Therefore, a correction value calculation section 110c obtains the correction value difference $\Delta V_{ODAC}$ using an equation different from that of the second embodiment. Specifically, when the total amplification factor obtained, starting from the signal conditioning section 103 to the first digital-to-analog conversion section 104, is GA and the amplification factor of the first amplification section 105 is $G_M$, the correction value difference $\Delta V_{ODAC}$ is obtained by the following equation (6).

$$\Delta V_{ODAC} = (\Delta V_{AMO} - \Delta V_{2cal})/(G_{LDO} \cdot G_M \cdot GA) \quad (6)$$

Further, the correction value $V_{ODAC}$ obtained based on the correction value difference $\Delta V_{ODAC}$ is inputted, remaining a digital value, to the addition section 106c and added to a digital signal outputted from the correction section 102.

Note that as a variation of the first embodiment, the addition section 106c may be provided between the correction section 102 and the signal conditioning section 103 in a similar manner to FIG. 13. In this case, the correction value difference $\Delta V_{ODAC}$ is obtained by the following equation (7).

$$\Delta V_{ODAC} = -\Delta V_{2cal}/(G_{LDO} \cdot G_M \cdot GA) \quad (7)$$

Fifth Embodiment

Since structures of a communication terminal and a transmitter of the fifth embodiment are similar to those of the first embodiment, FIGS. 1 and 2 are used therefor. Further, in the fifth embodiment, elements having the same functions as those of the first and second embodiments will be denoted by the same reference numerals, and therefore will not be described.

Figure 14:
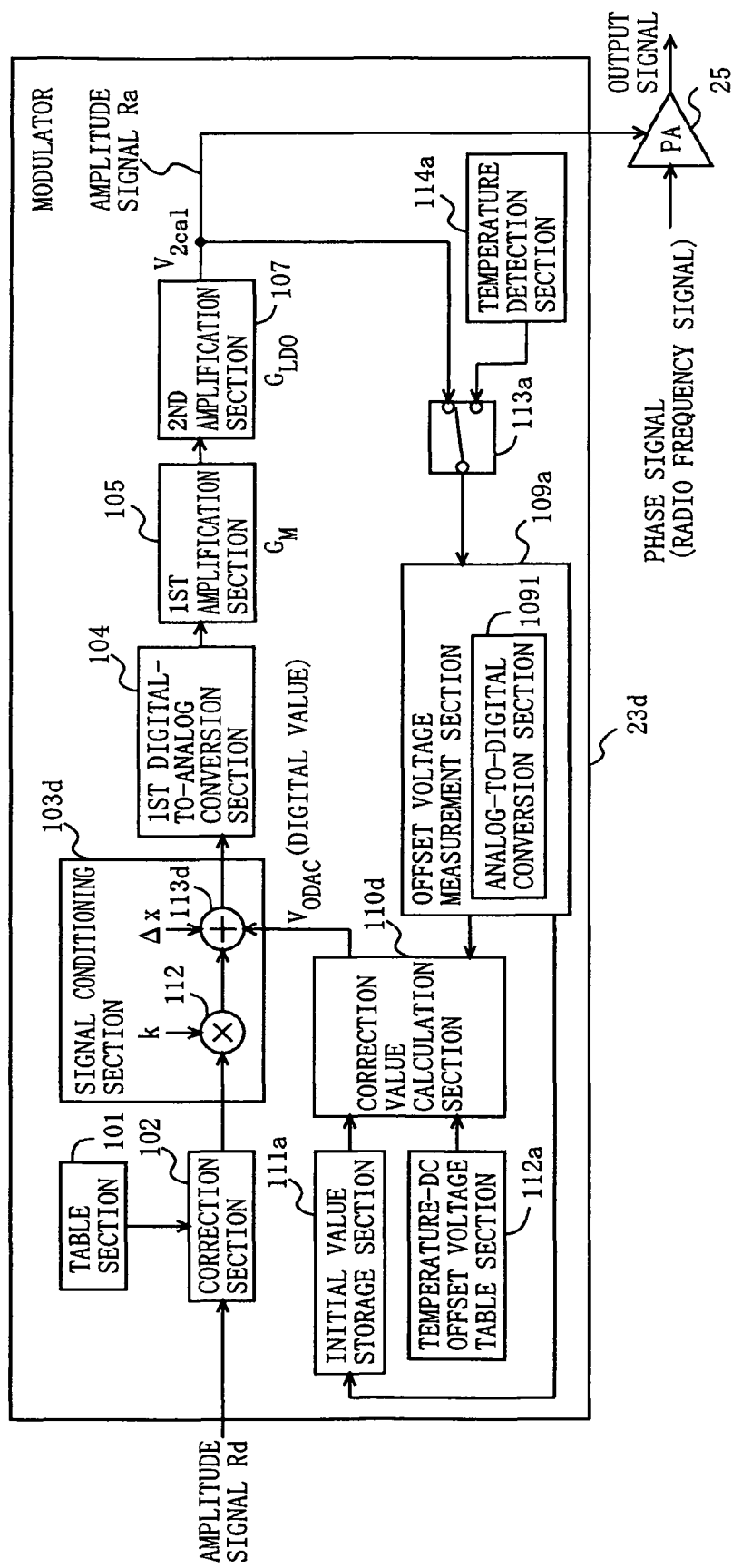
FIG. 14 is a diagram showing a structure of a modulator 23d according to the fifth embodiment of the present invention.

FIG. 14 is a diagram showing a structure of the modulator 23d according to the fifth embodiment of the present invention. In the fifth embodiment, the correction value $V_{ODAC}$ is inputted to an addition section 113d provided within a signal conditioning section 103d. Therefore, a correction value calculation section 110d obtains the correction value difference $\Delta V_{ODAC}$ using an equation different from that of the second embodiment. Specifically, when the amplification factor of the first digital-to-analog conversion section 104 is $G_B$ and the amplification factor of the first amplification section 105 is $G_M$, the correction value difference $\Delta V_{ODAC}$ is obtained by the following equation (8).

$$\Delta V_{ODAC} = (\Delta V_{AMO} \Delta V_{2cal})/(G_{LDO} \cdot G_M \cdot G_B) \quad (8)$$

Further, the correction value $V_{ODAC}$ obtained based on the correction value difference $\Delta V_{ODAC}$ is inputted, remaining a digital value, to the addition section 113d and the temporal changes of the offset value a are corrected in the signal conditioning section 103d.

Note that as a variation of the first embodiment, the correction value $V_{ODAC}$ may be inputted to the addition section 113d provided within the signal conditioning section 103d in a similar manner to FIG. 14. In this case, the correction value difference $\Delta V_{ODAC}$ is obtained by the following equation (9).

$$\Delta V_{ODAC} = -\Delta V_{2cal}/(G_{LDO} \cdot G_M \cdot G_B) \quad (9)$$

As shown in the fifth embodiment, since the correction value $V_{ODAC}$ is added in the signal conditioning section 103d, it is possible to remove the second digital-to-analog conversion section 108, as with the fourth embodiment. Consequently, it is expected to reduce a device in size and reduce costs.

As shown in the third through fifth embodiments, according to the present invention, the correction value $V_{ODAC}$ may only be determined based on a value obtained by dividing the amount of change of the offset voltage and/or of the DC offset voltage by the amplification factor obtained after the correction value is added (except for the amplification factor of the power amplifier 25), and therefore the position of the addition section is not particularly specified.

Further, as can be seen by comparing the first through third embodiments to the fourth and fifth embodiments, the correction value of an analog signal may be added and the correction value of a digital signal may be added. That is, the addition section for adding the correction value $V_{ODAC}$ may only be positioned so as to add the correction value $V_{ODAC}$ to a specific signal processed until the amplitude signal Ra is generated based on an input signal to the modulator. In the first through third embodiments, the correction value $V_{ODAC}$ is added to a specific signal which is an analog signal. Particularly, in the first and second embodiments, the addition section is present at a stage preceding the second amplification section 107 for amplifying the specific signal to the amplitude signal Ra. In the fourth and fifth embodiments, the correction value $V_{ODAC}$ is added to a specific signal which is a digital signal.

Sixth Embodiment

Since structures of a communication terminal and a transmitter of the sixth embodiment are similar to those of the first embodiment, FIGS. 1 and 2 are used therefor. Further, in the sixth embodiment, elements having the same functions as those of the first embodiment will be denoted by the same reference numerals, and therefore will not be described.

Figure 15:
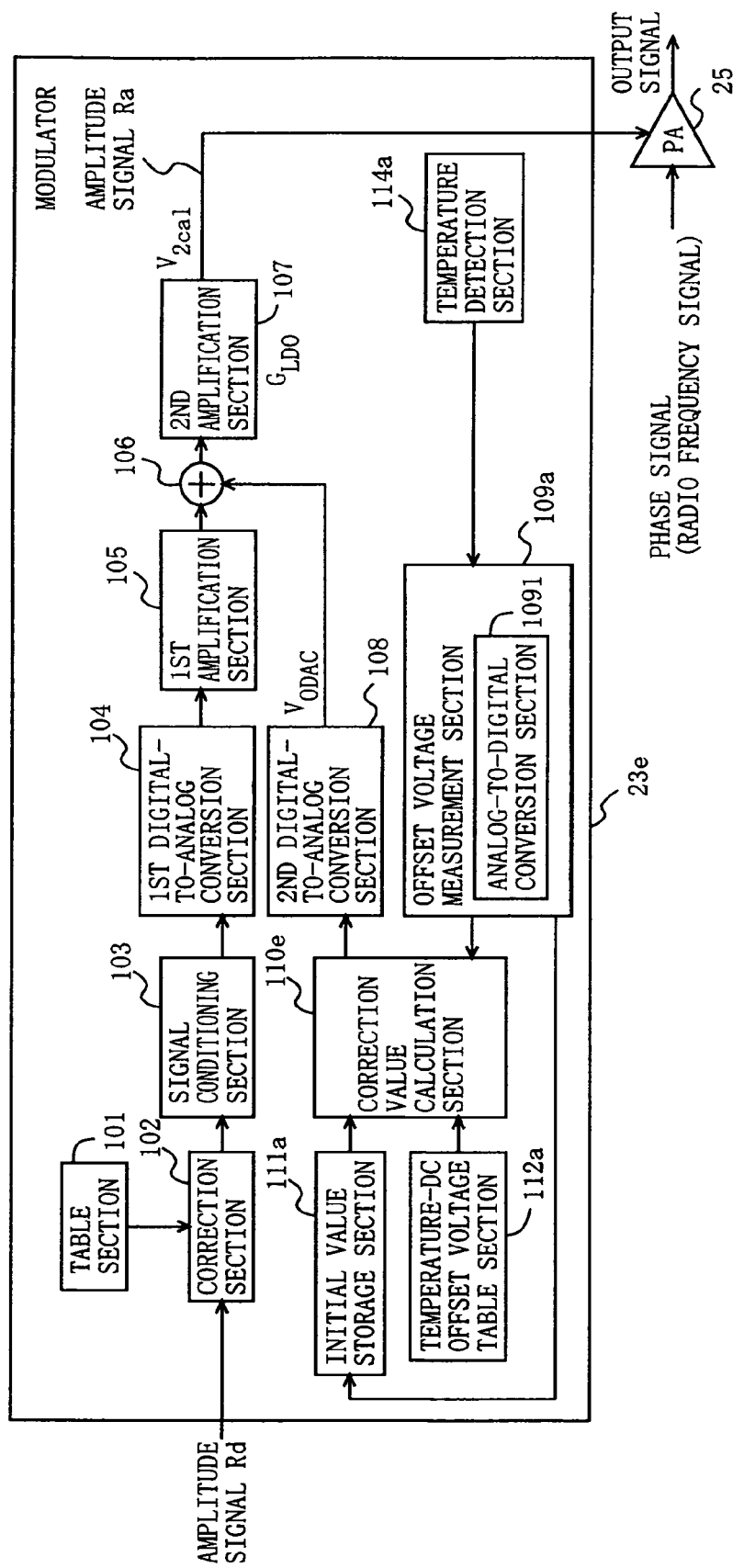
FIG. 15 is a diagram showing a structure of a modulator 23e according to the sixth embodiment of the present invention.
Figure 16:
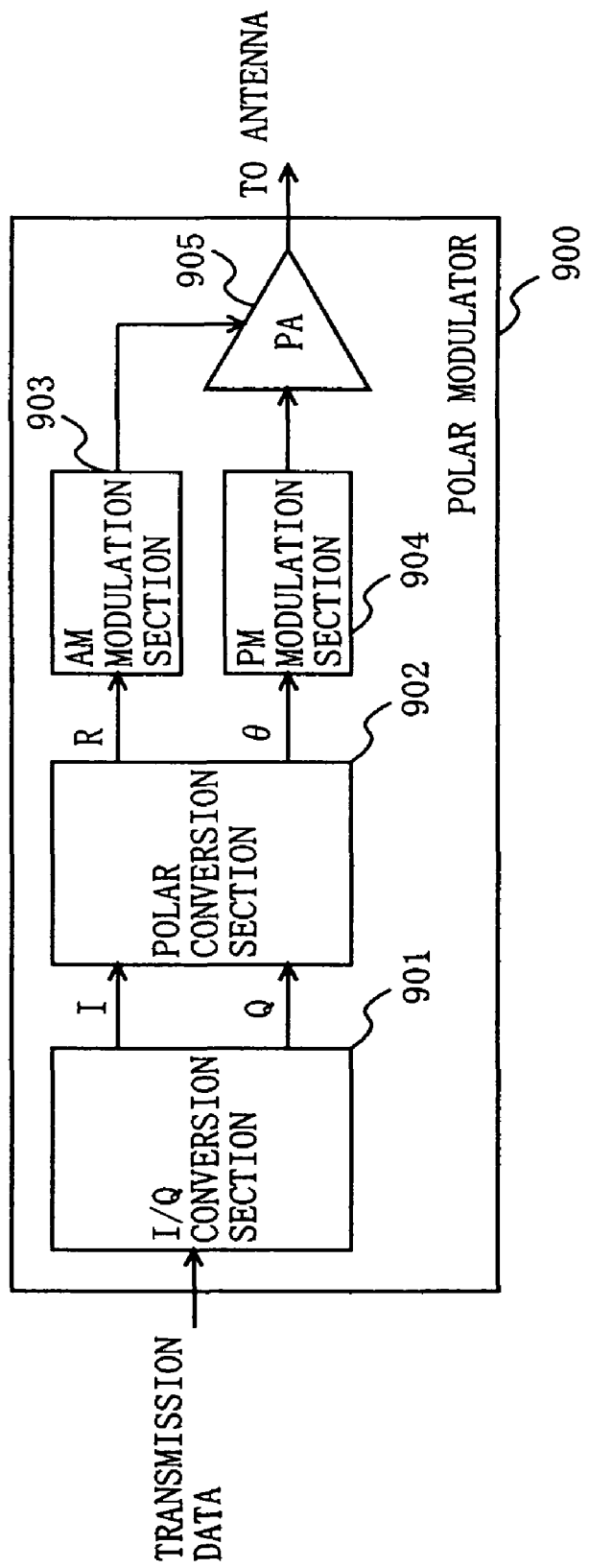
FIG. 16 is a diagram showing an example structure of a polar modulator 900 used in a transmitter of a conventional polar modulation system.
Figure 17A:
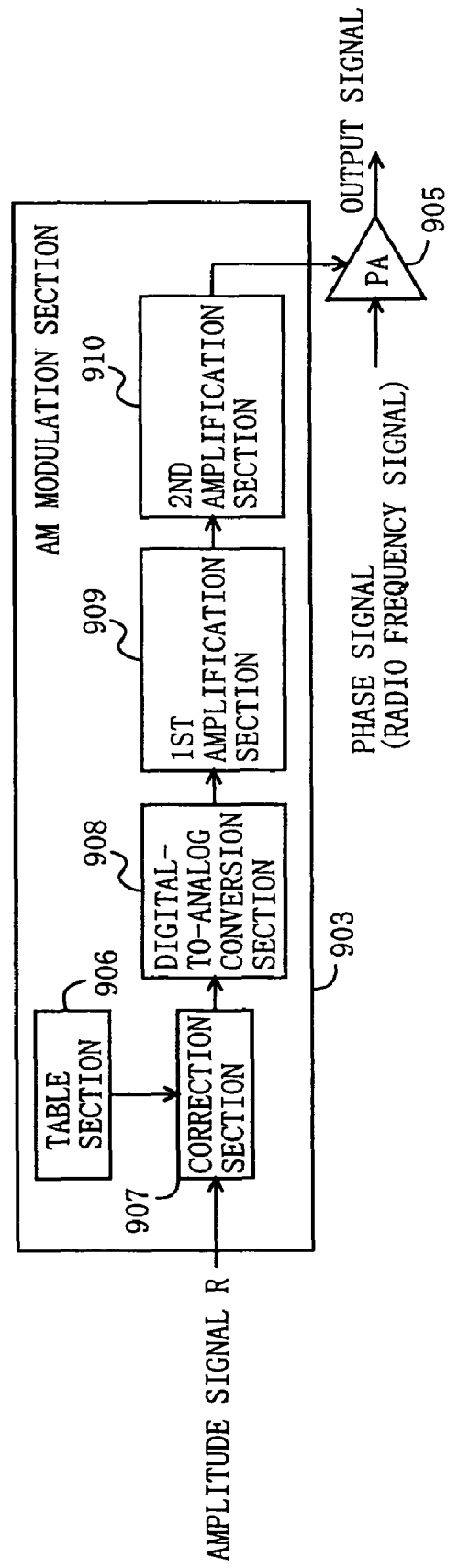
FIG. 17A is a diagram showing a structure of an AM modulation section 903 having a conventional system for correcting nonlinearity.
Figure 17B:
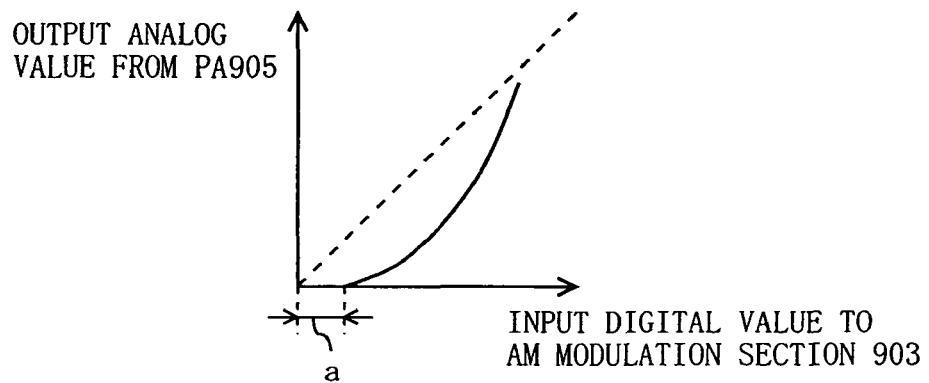
FIG. 17B is a diagram showing a relationship between an input digital value to the AM modulation section 903 and an output analog value from a power amplifier 905.
Figure 17C:
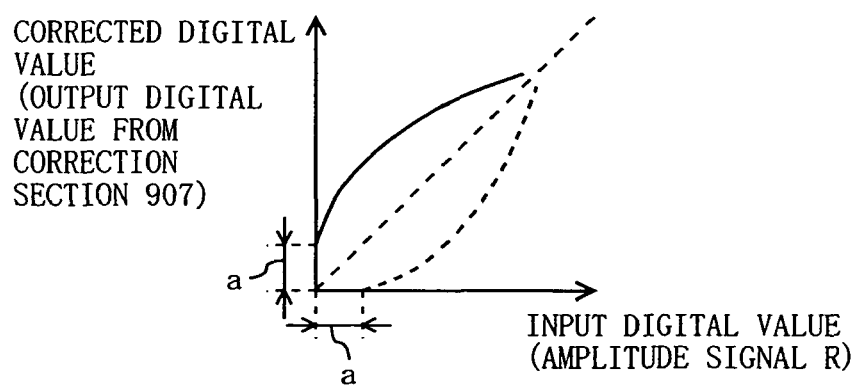
FIG. 17C is a diagram showing the characteristics of a correction table stored in a table section 906.
Figure 17D:
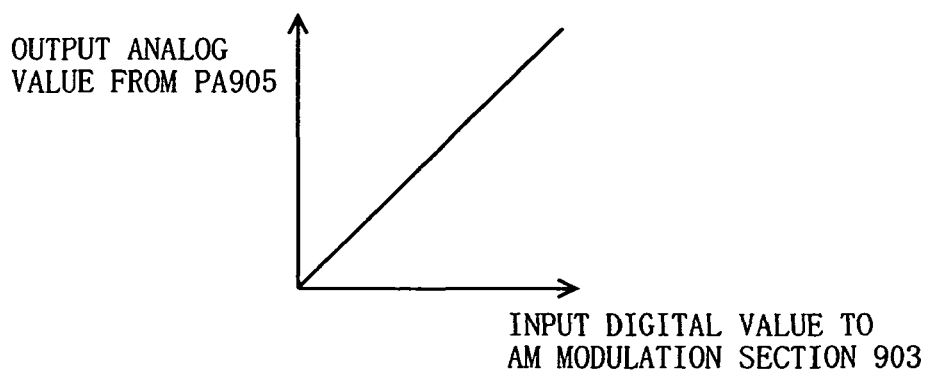
FIG. 17D is a diagram showing a case where input/output characteristics are linearized.

FIG. 15 is a diagram showing a structure of the modulator 23e according to the sixth embodiment of the present invention. In the sixth embodiment, a correction value calculation section 110e determines the correction value $V_{ODAC}$ by only calculating the difference value $\Delta V_{AMO}$ by measuring a temperature, without calculating the correction value $V_{ODAC}$ by measuring the offset voltage $V_{2cal}$. That is, the correction value calculation section 110e determines the correction value $V_{ODAC}$ by the following equation (10) at the start of the transmission and/or during the transmission of the data.

$$\Delta V_{ODAC} = \Delta V_{AMO}/G_{LDO} \quad (10)$$

As described above, even when only the correction value $V_{ODAC}$ obtained by only measuring a temperature is added, it is possible to correct the nonlinearity in accordance with the temporal changes of the offset value a, which are caused by temperature changes and are the characteristics of the power amplifier 25. Note that the initial value of the offset voltage $V_{2cal}$ may not be stored in the initial value storage section 111.

While the invention has been described in detail, the foregoing description is in all aspects illustrative and not restrictive. It is understood that numerous other modifications and variations can be devised without departing from the scope of the invention.

What is claimed is:

1. A modulator for correcting an input signal by at least adding thereto a predetermined offset value and for generating, based on the corrected input signal, an amplitude signal for amplitude-modulating a radio-frequency signal, the modulator comprising:
    an offset voltage measurement section operable to measure an offset voltage of the amplitude signal;
    a correction value calculation section operable to obtain an amount of change of the offset voltage measured by the offset voltage measurement section and operable to calculate, based on the amount of change, a correction value for correcting the offset voltage; and
    an addition section operable to add the correction value calculated by the correction value calculation section to a specific signal processed until the amplitude signal is generated from the input signal.

2. The modulator according to claim 1, wherein the correction value calculation section determines the correction value based on a value obtained by dividing the amount of change of the offset voltage by an amplification factor obtained after the correction value is added.

3. The modulator according to claim 1, wherein the correction value calculation section calculates the correction value at the start of transmission, and the addition section adds the correction value to the specific signal at the start of the transmission.

4. The modulator according to claim 1, wherein the offset voltage measurement section includes an analog-to-digital conversion section operable to convert the measured offset voltage into a digital signal, and the amplitude signal is a signal of which the offset voltage, measured by the offset voltage measurement section, can be analog-to-digital converted by the analog-to-digital conversion section.

5. The modulator according to claim 1, wherein:
    the radio-frequency signal is amplitude-modulated by the amplitude signal in a power amplifier;
    the modulator further comprises
    a temperature detection section operable to detect a temperature, and
    a storage section operable to have stored therein a relationship between a DC offset voltage and a temperature of the power amplifier; and
    with reference to the storage section, the correction value calculation section obtains an amount of change of the DC offset voltage based on the temperature detected by the temperature detection section and calculates, based on the amount of change of the DC offset voltage, the correction value for correcting the offset voltage.

6. The modulator according to claim 5, wherein the correction value calculation section determines the correction value based on a value obtained by dividing the amount of change of the DC offset voltage by an amplification factor obtained after the correction value is added.

7. The modulator according to claim 5, wherein the correction value calculation section calculates the correction value during transmission, and the addition section adds the correction value to the specific signal during the transmission.

8. The modulator according to claim 5, wherein the correction value calculation section calculates the correction value based on the amount of change of the offset voltage and the amount of change of the DC offset voltage at the start of transmission, and the addition section adds the correction value to the specific signal at the start of the transmission.

9. The modulator according to claim 8, wherein the correction value calculation section determines the correction value based on a value obtained by dividing a difference value between the amount of change of the DC offset voltage and the amount of change of the offset voltage, by an amplification factor obtained after the correction value is added.

10. The modulator according to claim 1, wherein the addition section is provided at a position of adding the correction value to the specific signal which is analog.

11. The modulator according to claim 10, wherein the addition section is provided at a stage preceding an amplification section operable to amplify the amplitude signal.

12. The modulator according to claim 1, wherein the addition section is provided at a position of adding the correction value to the specific signal which is digital.

13. The modulator according to claim 12, further comprising:
    a correction section operable to correct the input signal which is digital; and
    a signal conditioning section operable to linear-transform the digital signal outputted from the correction section, wherein
    the addition section is provided within the signal conditioning section.

14. The modulator according to claim 12, further comprising
    a correction section operable to correct the input signal which is digital, wherein
    the addition section is provided at a stage following the correction section.

15. A transmitter for polar-modulating and transmitting transmission data which is digital, the transmitter comprising:
    an I/Q conversion section operable to convert the transmission data into an in-phase component and a quadrature component;
    a polar conversion section operable to convert the in-phase component and the quadrature component which are obtained by the I/Q conversion section, into an amplitude component and a phase component, respectively;
    a modulation section operable to convert the amplitude component into an analog signal and operable to output the analog signal as an amplitude signal;
    a PM modulation section operable to phase-modulate a radio-frequency signal based on the phase component; and
    a power amplification section operable to modulate the radio-frequency signal outputted from the PM modulation section, by the amplitude signal outputted from the modulation section and operable to output a transmission signal, wherein
the modulation section includes:
an offset voltage measurement section operable to measure an offset voltage of the amplitude signal;
a correction value calculation section operable to obtain an amount of change of the offset voltage measured by the offset voltage measurement section and operable to calculate, based on the amount of change, a correction value for correcting the offset voltage; and
an addition section operable to add the correction value calculated by the correction value calculation section to a specific signal processed until the amplitude signal is generated from the amplitude component.

16. A communication terminal having a transmitter for polar-modulating and transmitting transmission data which is digital,
the transmitter comprising:
an I/Q conversion section operable to convert the transmission data into an in-phase component and a quadrature component;
a polar conversion section operable to convert the in-phase component and the quadrature component which are obtained by the I/Q conversion section, into an amplitude component and a phase component, respectively;
a modulation section operable to convert the amplitude component into an analog signal and output the analog signal as an amplitude signal;
a PM modulation section operable to phase-modulate a radio-frequency signal based on the phase component; and
a power amplification section operable to modulate the radio-frequency signal outputted from the PM modulation section, by the amplitude signal outputted from the modulation section and operable to output a transmission signal, wherein
the modulation section includes:
an offset voltage measurement section operable to measure an offset voltage of the amplitude signal;
a correction value calculation section operable to obtain an amount of change of the offset voltage measured by the offset voltage measurement section and operable to calculate, based on the amount of change, a correction value for correcting the offset voltage; and
an addition section operable to add the correction value calculated by the correction value calculation section to a specific signal processed until the amplitude signal is generated from the amplitude component.

17. A method for correcting an input signal by at least adding thereto a predetermined offset value and for generating, based on the corrected input signal, an amplitude signal for amplitude-modulating a radio-frequency signal, the method comprising:
measuring an offset voltage of the amplitude signal;
obtaining an amount of change of the measured offset voltage and calculate, based on the amount of change, a correction value for correcting the offset voltage; and
adding the correction value to a specific signal processed until the amplitude signal is generated from the input signal.

18. A modulator for correcting an input signal by at least adding thereto a predetermined offset value and for generating, based on the corrected input signal, an amplitude signal for amplitude-modulating a radio-frequency signal in a power amplifier, the modulator comprising:
a temperature detection section operable to detect a temperature;
a storage section operable to have stored therein a relationship between a DC offset voltage and a temperature of the power amplifier;
a correction value calculation section operable to obtain, with reference to the storage section, an amount of change of the DC offset voltage based on the temperature detected by the temperature detection section and operable to calculate, based on the amount of change of the DC offset voltage, a correction value for correcting an offset voltage; and
an addition section operable to add the correction value calculated by the correction value calculation section to a specific signal processed until the amplitude signal is generated from the input signal.

* * * * *